US010782332B2

(12) United States Patent
Frasch et al.

(10) Patent No.: US 10,782,332 B2
(45) Date of Patent: Sep. 22, 2020

(54) TRANSVERSE ELECTROMAGNETIC (TEM) SYSTEM AND METHOD OF MANUFACTURE

(71) Applicant: THE BOEING COMPANY, Chicago, IL (US)

(72) Inventors: Lydell L. Frasch, Dardenne Prairie, MO (US); Benjamin R. Blakely, Brier, WA (US); Brian M. Finn, St. Peters, MO (US); Eugene Sorensen, Renton, WA (US); Kyle Weber, Seattle, WA (US)

(73) Assignee: THE BOEING COMPANY, Chicago, IL (US)

( * ) Notice: Subject to any disclaimer, the term of this patent is extended or adjusted under 35 U.S.C. 154(b) by 28 days.

(21) Appl. No.: 16/290,452

(22) Filed: Mar. 1, 2019

(65) Prior Publication Data
US 2020/0110120 A1 Apr. 9, 2020

Related U.S. Application Data

(60) Provisional application No. 62/742,544, filed on Oct. 8, 2018.

(51) Int. Cl.
G01R 29/08 (2006.01)
H01Q 17/00 (2006.01)
B64F 5/10 (2017.01)
B64D 47/00 (2006.01)

(52) U.S. Cl.
CPC ......... *G01R 29/0828* (2013.01); *B64D 47/00* (2013.01); *B64F 5/10* (2017.01); *G01R 29/0878* (2013.01); *H01Q 17/00* (2013.01)

(58) Field of Classification Search
CPC ... G01R 29/0828; G01R 29/0878; B64F 5/10; B64D 47/00; H01Q 17/00
USPC .......................................................... 343/703
See application file for complete search history.

(56) References Cited

U.S. PATENT DOCUMENTS

| 4,016,507 | A | * | 4/1977 | Havens | .................. | H03B 9/143 |
| | | | | | | 331/96 |
| 4,837,581 | A | | 6/1989 | Hansen et al. | | |
| 4,967,162 | A | * | 10/1990 | Barnett | .................. | H01J 25/34 |
| | | | | | | 330/43 |
| 5,436,603 | A | | 7/1995 | Fischer | | |
| 5,748,002 | A | * | 5/1998 | Scott | ...................... | G01N 22/00 |
| | | | | | | 324/633 |

(Continued)

*Primary Examiner* — Don P Le
(74) *Attorney, Agent, or Firm* — Joseph F. Harding; The Small Patent Law Group LLC

(57) ABSTRACT

An assembly is provided for a transverse electromagnetic (TEM) system. The assembly includes a support frame and at least one resistive sheet. The support frame includes an upper plate and a lower plate. The upper plate defines a first inner surface and an opposed first outer surface. The lower plate defines a second inner surface and an opposed second outer surface. The at least one resistive sheet is coupled to at least one of the upper plate or the lower plate, and extends parallel to the upper plate and lower plate from an exterior of the support frame. The resistive sheet has an inner end disposed proximate the at least one of the upper plate or lower plate and an outer end disposed opposite the inner end, and has a variable resistance that is greater at the outer end than at the inner end.

20 Claims, 17 Drawing Sheets

(56) References Cited

U.S. PATENT DOCUMENTS

| | | | | |
|---|---|---|---|---|
| 5,793,215 A * | 8/1998 | Yun | G01R 29/105 324/627 |
| 5,844,413 A * | 12/1998 | Hansen | G01R 29/0828 324/627 |
| 6,856,131 B2 | 2/2005 | Miyazawa et al. | |
| 6,879,298 B1 * | 4/2005 | Zarro | H01Q 13/025 343/756 |
| 8,610,630 B2 * | 12/2013 | Yun | H01P 5/12 324/627 |
| 9,377,494 B2 * | 6/2016 | Choi | G01R 29/0814 |
| 9,773,587 B1 * | 9/2017 | Gregoire | G01R 33/12 |
| 2002/0005725 A1 * | 1/2002 | Scott | G01R 1/06772 324/637 |
| 2006/0132115 A1 * | 6/2006 | Maurice | G01R 29/0878 324/72.5 |
| 2007/0164755 A1 * | 7/2007 | Stojcevic | G01R 29/105 324/627 |
| 2010/0171669 A1 * | 7/2010 | Ito | G01R 29/10 343/703 |
| 2012/0176150 A1 * | 7/2012 | Hsu | G01R 27/32 324/754.03 |
| 2012/0293379 A1 * | 11/2012 | Nickel | G01R 31/2822 343/703 |
| 2013/0006553 A1 * | 1/2013 | Kwon | H05K 9/0069 702/57 |
| 2013/0176047 A1 * | 7/2013 | Peng | H01Q 13/085 324/750.26 |
| 2014/0159706 A1 * | 6/2014 | Jeon | G01R 29/0828 324/201 |
| 2014/0162628 A1 * | 6/2014 | Bevelacqua | H04B 17/26 455/423 |
| 2015/0097575 A1 * | 4/2015 | Hiraga | G01R 31/002 324/537 |
| 2015/0219712 A1 * | 8/2015 | Pouzalgues | G01R 29/0878 324/702 |
| 2016/0164189 A1 * | 6/2016 | Jafarlou | H01P 5/08 343/786 |
| 2016/0266322 A1 * | 9/2016 | Epitaux | G02B 6/138 |
| 2018/0032853 A1 * | 2/2018 | Sugimura | H01Q 1/38 |
| 2018/0188303 A1 * | 7/2018 | Hwang | H01P 1/268 |
| 2019/0074568 A1 * | 3/2019 | Henry | H01P 5/188 |
| 2020/0083927 A1 * | 3/2020 | Henry | H01P 3/16 |
| 2020/0145913 A1 * | 5/2020 | Barzegar | H04W 84/045 |

* cited by examiner

TRANSVERSE ELECTROMAGNETIC (TEM) SYSTEM AND METHOD OF MANUFACTURE

RELATED APPLICATIONS

This application claims priority to U.S. Provisional Patent Application, Ser. No. 62/742,544, filed Oct. 8, 2018 and entitled "Transverse Electromagnetic (TEM) System and Method of Manufacture," the entire content of which is hereby incorporated by reference.

BACKGROUND

Transverse electromagnetic (TEM) cells are used to measure material properties, two-dimensional (2D) scattering from components, and received signals at low radio-frequency (RF) frequencies. TEM cells typically contain a test cavity that allows propagation of a TEM wave, wherein the reflected or received signal contains information about the component being tested. However, many of these materials and components that are tested have very low return signal levels. Current TEM cells have very limited dynamic range and are not capable of reliably measuring these low levels. Moreover, current TEM cells may be unstable and susceptible to outside noise. As a result, providing reliable test results is limited and/or use of existing TEM cells cannot provide all the needed tests.

SUMMARY

Accordingly, a need exists for a more stable TEM system that can reliably measure low-level signals from test components and that is less susceptible to outside noise.

Some examples provide a support frame for a transverse electromagnetic (TEM) system. The support frame includes an upper plate, a lower plate, side support members, an upper support structure, and a lower support structure. The upper plate defines a first inner surface and an opposed first outer surface. The first inner surface is oriented toward a TEM test space. The lower plate defines a second inner surface and an opposed second outer surface. The second inner surface is oriented toward the first inner surface of the upper plate and toward the TEM test space. The TEM test space is defined between the first inner surface of the upper plate and the second inner surface of the lower plate. The side support members are disposed between the upper plate and the lower plate proximate a periphery of the test space. The upper support structure is coupled to and supports the upper plate. The upper support structure extends from the first outer surface of the upper plate. The lower support structure is coupled to and supports the lower plate. The lower support structure extends from the second outer surface of the lower plate.

In other examples, a method is provided (e.g., for forming a support frame for a transverse electromagnetic (TEM) system. The method includes coupling a lower support structure to a lower plate. The lower plate defines a second inner surface and an opposed second outer surface. The second inner surface is configured to be oriented toward a TEM test space, and the lower support structure extends from the second outer surface of the lower plate. The method also includes positioning side support members above the second inner surface of the lower plate proximate a periphery of the test space. Also, the method includes coupling an upper support structure to an upper plate. The upper plate defines a first inner surface and an opposed first outer surface. The upper support structure extends from the first outer surface of the upper plate. Further, the method includes positioning the upper plate above the side support members with the first inner surface oriented toward the second inner surface of the lower plate and toward the TEM test space, with the TEM test space defined between the first inner surface of the upper plate and the second inner surface of the lower plate.

Other examples provide an assembly for a transverse electromagnetic (TEM) system. The assembly includes a support frame and at least one resistive sheet. The support frame includes an upper plate and a lower plate. The upper plate defines a first inner surface and an opposed first outer surface. The first inner surface is oriented toward a TEM test space. The lower plate defines a second inner surface and an opposed second outer surface. The second inner surface is oriented toward the first inner surface of the upper plate and toward the TEM test space, with the TEM test space defined between the first inner surface of the upper plate and the second inner surface of the lower plate. The at least one resistive sheet is coupled to at least one of the upper plate or the lower plate, and extends parallel to the upper plate and lower plate from an exterior of the support frame. The resistive sheet has an inner end disposed proximate the at least one of the upper plate or lower plate and an outer end disposed opposite the inner end, and has a variable resistance that is greater at the outer end than at the inner end.

Still other examples provide an assembly for a transverse electromagnetic (TEM) system. The assembly includes a support frame and resistive blocks. The support frame includes an upper plate and a lower plate. The upper plate defines a first inner surface and an opposed first outer surface, with the first inner surface oriented toward a TEM test space. The lower plate defines a second inner surface and an opposed second outer surface, with the second inner surface oriented toward the first inner surface of the upper plate and toward the TEM test space. The TEM test space is defined between the first inner surface of the upper plate and the second inner surface of the lower plate. The support frame defines a length extending from a source side toward an object side and width extending normal to the length. The resistive blocks are disposed along the width proximate the object side, with each resistive block having first and second resistive sides opposed to each other and oriented along the width.

Other examples provide a method that includes providing a support frame comprising an upper plate and a lower plate. The upper plate defines a first inner surface and an opposed first outer surface. The first inner surface is oriented toward a transverse electromagnetic (TEM) test space. The lower plate defines a second inner surface and an opposed second outer surface. The second inner surface is oriented toward the first inner surface of the upper plate and toward the TEM test space, with the TEM test space defined between the first inner surface of the upper plate and the second inner surface of the lower plate. The method also includes coupling at least one resistive sheet to at least one of the upper plate or the lower plate. The at least one resistive sheet extends parallel to the upper plate and lower plate from an exterior of the support frame. The resistive sheet has an inner end disposed proximate the at least one of the upper plate or lower plate and an outer end disposed opposite the inner end, with the resistive sheet having a variable resistance that is greater at the outer end than at the inner end.

Other examples provide a source assembly for a transverse electromagnetic (TEM) system. The source assembly includes a first guide and a second guide. The first guide is configured to receive a signal from a supply, and includes a first shell defining a first cavity. The first guide is configured to extend proximate an upper plate of the TEM system. The second guide is configured to receive a reference signal from the supply. The second guide includes a second shell defining a second cavity. The second guide is configured to extend proximate a lower plate of the TEM system, and is spaced a distance from the first guide to define a gap having a gap width. At least one of the first guide or second guide includes an access opening configured to provide access to at least one of the first cavity or the second cavity.

In other examples, a method is provided that includes mounting a first guide to a transverse electromagnetic (TEM) structure to extend proximate an upper plate of the TEM system. The first guide includes a first shell defining a first cavity. The method also includes coupling the first guide to a supply for receiving a signal from the supply. Also, the method includes mounting a second guide to the TEM structure a distance from the first guide to define a gap having a gap width. The second guide extends proximate a lower plate of the TEM system, and includes a second shell defining a second cavity. At least one of the first guide or second guide comprises an access opening configured to provide access to at least one of the first cavity or the second cavity. The method also includes coupling the second guide to the supply for receiving a reference signal from the supply. Further, the method includes transmitting the signal and reference signal via the first guide and the second guide, respectively, toward an object, and receiving a return signal from the object.

Still other examples provide a source assembly for a transverse electromagnetic (TEM) system. The source assembly includes a first guide and a second guide. The first guide is configured to receive a signal from a supply, and is configured to extend proximate an upper plate of the TEM system. The second guide is configured to receive a reference signal from the supply, and is configured to extend proximate a lower plate of the TEM system. The second guide is spaced a distance from the first guide to define a gap having a gap width. The first guide has a first tapered side and the second guide has a second tapered side oriented toward each other. The first tapered side and the second tapered side each include a taper that continuously reduces in slope toward an end point oriented toward an object to be tested in the TEM system.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

Corresponding reference characters indicate corresponding parts throughout the drawings.

DETAILED DESCRIPTION

Referring to the figures, some examples of the disclosure provide a transverse electromagnetic (TEM) system, or TEM cell, capable of testing components (e.g., measure material properties, two-dimensional (2D) scattering from components, and received signals at low RF frequencies). Various examples include a parallel plate waveguide to measure material properties of a component having very low return signals, such as to determine electromagnetic (EM) properties of the component. For example, in a radar application, the TEM system is capable of measuring the (2D) radar cross-section (RCS) of, for example, vehicle components, as well as antenna performance. However, it should be appreciated that the herein disclosed examples of TEM systems can be used to measure different properties of different components.

The TEM system in some examples generally includes a TEM cell that has an external frame structure (exoskeleton). In an exemplary embodiment, the TEM cell is formed from a plurality of sectional panels that, when assembled, define an internal test space for performing testing to determine the EM properties of an object being tested. The example TEM system also includes a radio frequency (RF) absorbing structure that is disposed around an exterior of the test space defined by the TEM cell.

As described herein, the shape of the TEM cell and use of an RF absorbing structure around the perimeter of the test cell allows for more reliable measurement of material properties of the object under test at low RF frequencies (e.g., 30 MHz to 500 MHz). For example, the RF absorbing structure may be implemented as impedance sheets that are positioned to surround the perimeter of the TEM cell to thereby reduce reflections, particularly from the metal edge/air boundary of the fixture (e.g. reduces scattering from the TEM cell edges), which improves the dynamic range of the TEM system. By placing the TEM cell fixture within a shield enclosure outside RF noise is also reduced. Moreover, the mechanical design of the TEM cell, including the shape of the TEM cell, improves long term measurement stability and background levels.

Figure 1:
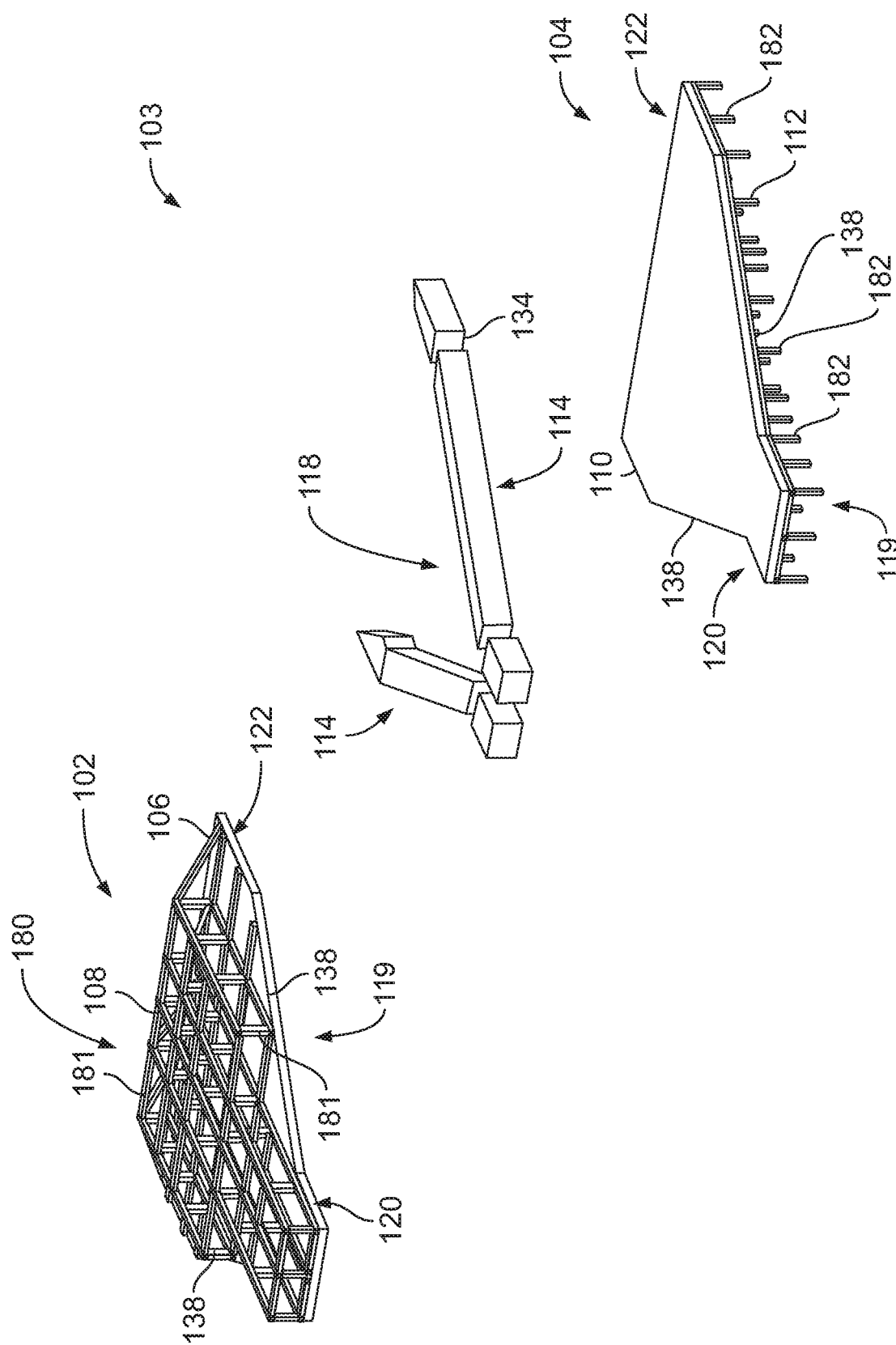
FIG. 1 provides an exploded perspective view of a support frame for a TEM system, according to an embodiment of the present disclosure.
Figure 2:
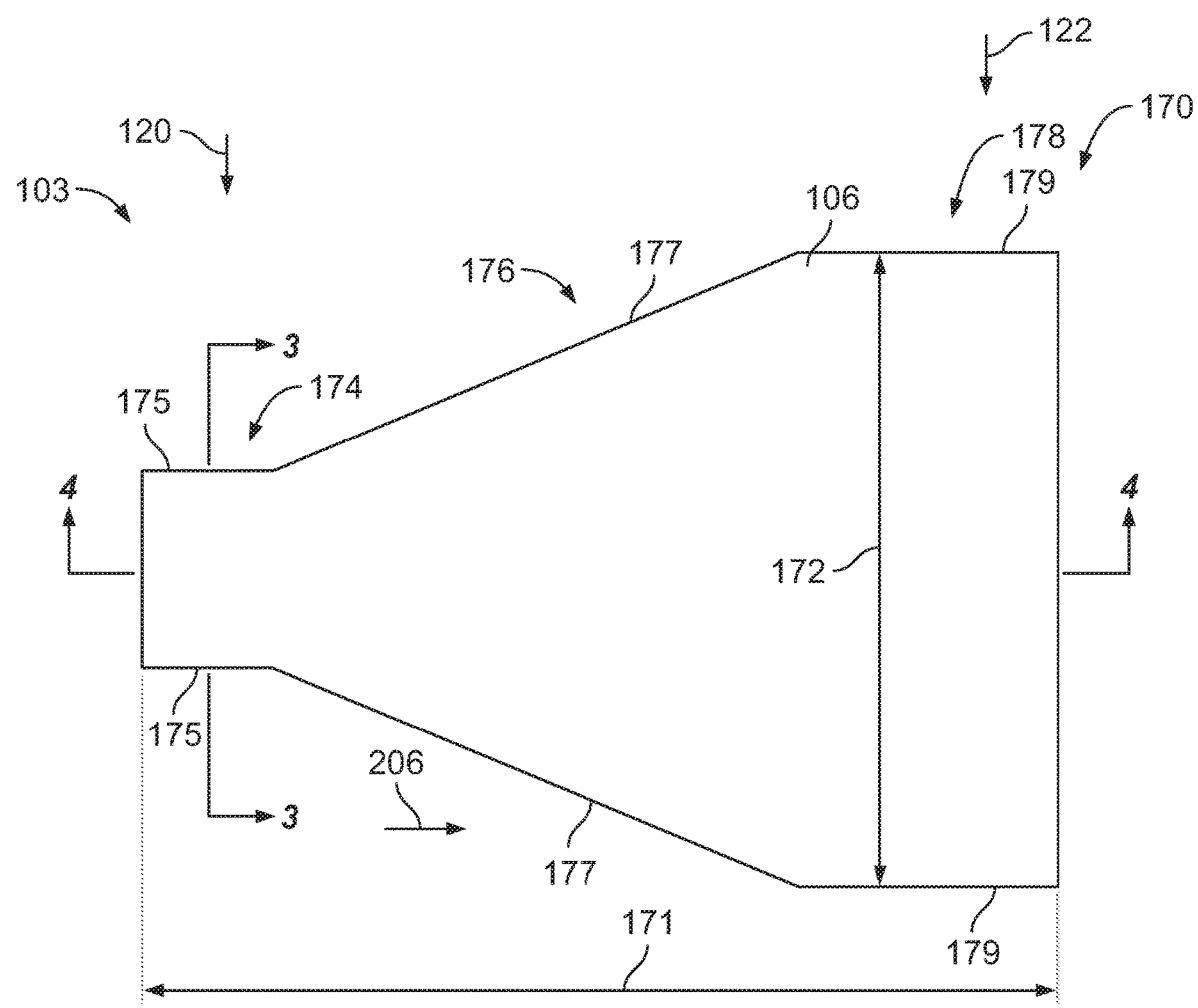
FIG. 2 provides a plan view of the support frame of FIG. 1.
Figure 3:
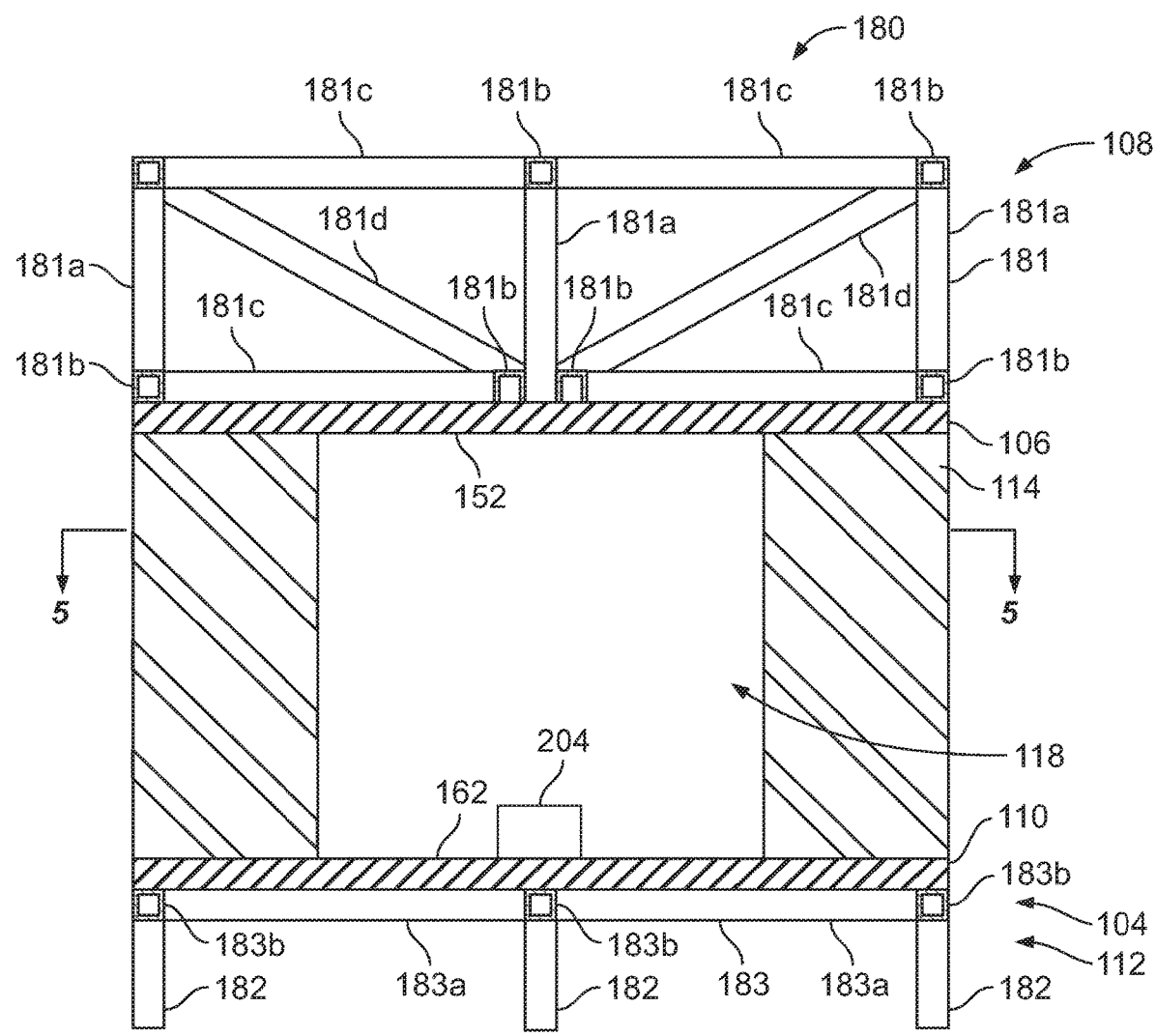
FIG. 3 provides a front sectional view of the support frame of FIG. 1 taken along line 3-3 of FIG. 2.
Figures 4, 5:
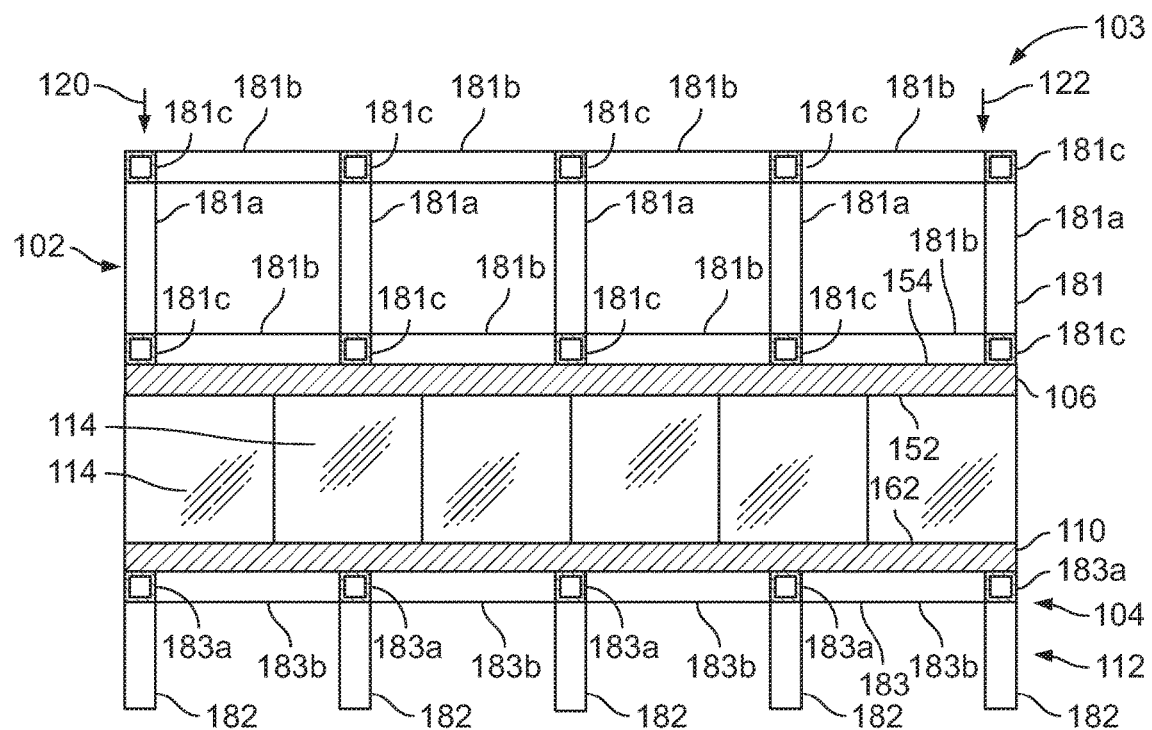
FIG. 4 provides a side sectional view of the support frame of FIG. 1 taken along line 4-4 of FIG. 2.
FIG. 5 provides a plan sectional view of the side support members of FIG. 1 taken along line 5-5 of FIG. 3.

FIG. 1 illustrates an exploded perspective view of a support frame 103 formed in accordance with various embodiments. FIG. 2 provides a plan view of the support frame 103, FIG. 3 provides a front sectional view of the support frame 103, FIG. 4 provides a side sectional view of the support frame 103, and FIG. 5 provides a plan sectional view of the side support members 114. Generally, the support frame 103 may be used with a TEM system 100, for example for testing EM properties of an object. (See, e.g., FIG. 10 and FIG. 22 for additional discussion regarding TEM system 100.) As seen in FIG. 1, the support frame 103 may be understood in various embodiments as including a first support assembly 102 (or upper support assembly), a second support assembly 104 (or lower support assembly), and side support members 114 disposed between the first support assembly 102 and the second support assembly 104. In various embodiments, the first and second support assemblies 102 and 104 each include at least a corresponding plate.

It may be noted that in various embodiments, the support frame 103 is shaped to help improve TEM system performance. For example, in the illustrated example, as best seen in FIG. 2, the depicted upper plate 106 (and lower plate 110 which is similarly shaped) defines a footprint 170. The footprint 170 has a length 171 that extends from a source side 120 (or first end) toward an object side 122 (or second end), and a width 172 that extends normal or perpendicular to the length 171. It may be noted that the source side 120 may be understood as corresponding to the end of the plate where a source is mounted, and the object side 122 as corresponding to the end of the plate opposite the source side. An object to be tested may not be located exactly at the end of the plate, but may be positioned further inboard.

A source (e.g., signal generator/receiver 136) for waves for TEM testing may be disposed at the source side 120, and an object 204 (see FIG. 5) to be tested disposed at the object side 122. As also seen in FIG. 5, an incident wave 200 may be sent from the source 136 to the object 204 along a propagation direction 206, and a reflected wave 202 returned from the object 204 toward the source 136. The footprint 170 has a tapered width along the propagation direction 206 that extends at least partially from the source side 120 toward the object side 122. As best seen in FIG. 5, the side members 114 are also laid out along the footprint 170. The tapered shape helps to avoid discontinuity and to help ensure the test wave 200 is as close to a plane wave as practical, while allowing the area of the test space 118 to flare outwardly along the propagation direction 206 to minimize scattering.

With returned reference to FIG. 2, the depicted example footprint 170 includes a first parallel portion 174, an intermediate tapered portion 176, and a second parallel portion 178. The first parallel portion 174 is located proximate the source side 120 (e.g., outside of the source 136 along the length 171), and includes first sides 175 that extend parallel to each other along the length 171 of the footprint 170. The second parallel portion 178 is located proximate the object side 122 (e.g., outside of the object 204 along the length 171), and includes second sides 179 that extend parallel to each other along the length 171. The intermediate tapered portion 176 is interposed between the first parallel portion 174 and the second parallel portion 178, and includes intermediate sides 177 that are tapered inwardly along the length 171 along the propagation direction 206. Accordingly, the sides of the footprint 170 are parallel in front of the source and behind the object but tapered between the source and object, allowing for tapering along the desired or intended path of waves along with a compact size outside of the desired or intended path of waves in the TEM test space 118.

For example, as best seen in FIG. 3 (which is a sectional view taken along lines 3-3 of FIG. 2) and FIG. 4 (which is a sectional view taken along lines 4-4 of FIG. 2), the support frame 103 includes an upper plate 106, a lower plate 110, side support members 114, the upper support structure 108, and the lower support structure 112. The upper plate 106 and upper support structure 108 form the first support assembly 102, and the lower plate 110 and lower support structure 112 form the second support assembly 104. The side support members 114 help support the upper plate 106 and space the upper plate 106 a distance from the lower plate 110 to provide a volume for testing an object (e.g., testing EM properties of an object).

The depicted upper plate 106 defines a first inner surface 152 and a first outer surface 154 that is opposed to the first inner surface 152. The first inner surface 152 is oriented toward a TEM test space 118. For example, an object whose EM properties are to be tested may be placed in the TEM space 118. The lower plate 110 defines a second inner surface 162 and a second outer surface 164 that is opposed to the second inner surface 162. The second inner surface 162 of the lower plate 110 is oriented toward the first inner surface 152 of the upper plate 106 and toward the TEM test space 118. Accordingly, the TEM test space 118 is defined between the first inner surface 152 of the upper plate 106 and the second inner surface 162 of the lower plate 110.

The upper plate 106 and lower plate 110 generally define the top and bottom of a parallel plate waveguide (e.g., a TEM cell) that allows for the propagation of a TEM wave. For example, an incident wave (e.g., TEM test wave) may be generated that propagates within the parallel plate waveguide toward a test object 204 from which the wave is reflected as a reflected signal. The reflected signal contains information about the object 204 according to EM testing technology (e.g., EM properties, performance characteristics, etc.) Generally, the upper plate 106 and lower plate 110 are made of a conductive material (e.g., aluminum) to form the parallel plate waveguide. It is desirable to provide as smooth and continuous a surface as possible for such a parallel plate waveguide, and to avoid or minimize flexing of the upper plate 106 and lower plate 110, which may affect the background noise, interference, and/or the accuracy of a calibration of the TEM system. In various embodiments, the support frame 103 may be used to define a relatively large TEM test space 118 (e.g., 40 feet by 60 feet). Various embodiments discussed herein include upper and lower support structures 108 and 112 that provide sufficient rigidity and support for the upper and lower plates (106, 110) to allow accurate testing for such a large space. For example, in various embodiments, the upper and lower plates (106, 110) are formed using 1 inch thick Aluminized honeycomb core sheet, with thick face sheets. Further, various embodiments use upper and lower support structures as discussed herein.

In the illustrated example, and still referring to FIGS. 3 and 4, the side support members 114 are disposed between the upper plate 106 and the lower plate 110 proximate a periphery 119 of the test space 118 (see FIG. 1). In various embodiments, outer edges of the side support members 114 are aligned with corresponding outer edges of the upper plate 106 and the lower plate 110. In various embodiments, the side support members 114 are formed from an electrically non-conductive material to reduce or avoid any potential interference from the side support members 114. For example, in various embodiments, foam blocks may be used to provide the side support members 114. The side support members 114 support the upper plate 106 above the lower plate 110, and define the height of the test space 118.

In various embodiments, and as shown in FIG. 5, the side support members 114 include a series of blocks 114a that are placed adjacent to each other. Further, in various embodiments, the side support members 114 define an opening 134 (e.g., a space in which no side support member 114 is disposed) along the periphery 119 of the test space 118. The opening 134 provides for access to the interior of the test space 118 (e.g., for placing or removing an object to be tested). The depicted opening 134 is located proximate the object side 122 (or side of the support frame 103 in which the object 204 is placed). Locating the opening 134 proximate the object side 122 in various embodiments helps reduce the effect of the opening 134 on scattering or interference during TEM testing.

It may be noted that, as discussed above, it is desirable to avoid flexing of the upper plate 106 and lower plate 110 for accurate, reliable measurements with a TEM system using the support frame 103. This is particularly so for larger support frames (e.g., test spaces 118 of 60 feet×40 feet, or even larger in some embodiments). To help provide support to the upper and lower plates (106, 110) and to help reduce flexing, while still providing a smooth continuous surface without interruptions or a minimum of interruptions on the interior of the test space, various embodiments use support structures mounted to exteriors (e.g., the portions of the plates oriented away from the test space 118) of the upper and lower plates (106, 110). For the example depicted in FIGS. 1-5, the support frame 103 includes the upper support structure 108 (which forms a first support assembly 102 with the upper plate 106, and the lower support structure 112 (which forms the second support assembly 104 with the lower plate 110).

As seen in FIGS. 1-4, the upper support structure 108 is coupled to and supports the upper plate 106. The upper support structure 108 extends from the first outer surface 154 of the upper plate 106. Accordingly, the upper support structure 108 extends up and away from the test space 118, and does not intrude on the test space 118 while providing support for the upper plate 106, for example, to reduce any flexing by the upper plate 106. In various embodiments, the upper support structure 108 includes a truss assembly 180 that includes members 181. Use of the truss assembly 180 that extends away from the first outer surface 154 helps provide rigidity and stability of the upper plate 106.

Generally, the truss assembly 180 may be understood as including members 181 that run both horizontally and vertically and are attached at various points or nodes. It may be noted that upper beams may also be referred to as top chords, lower beams may also be referred to as bottom chords, and interior beams may also be referred to as webs. In the illustrated example, as best seen in FIGS. 3 and 4, the members 181 of the truss assembly 180 include members 181a that extend vertically, members 181b that extend along the length of the upper support structure 108, members 181c that extend across the width of the upper support structure, and members 181d that extend diagonally (as best seen in FIG. 3). The members 181, for example, may be structural shapes (e.g., square tubing, I-beams, or the like) made of 8020 steel. It may be noted that other support structures may be utilized in various embodiments, including other truss arrangements, or, as another example, a network of ribs or gussets that extend upward from the upper plate 106.

As also seen in FIGS. 1, 3, and 4, the lower support structure 112 is coupled to and supports the lower plate 110. The lower support structure 112 extends from the second outer surface 164 of the lower plate 110. For example, the lower support structure 112 in various embodiments includes legs 182 that support the lower plate 110, and elevate the lower plate 110 off of the ground. Accordingly, the lower support structure 112 extends down and away from the test space 118, and does not intrude on the test space 118 while providing support for the lower plate 110, for example, to reduce any flexing by the lower plate 110. Further, the lower support structure 112 helps elevate the test space 118 off of the ground for improved isolation. In the illustrated example, as best seen in FIGS. 3 and 4, the lower support structure 112 includes members 183 that abut the lower plate 110, and from which the legs 182 extend. The members 183 of the depicted example include members 183a that extend along the width of the lower support structure 112 and members 183b that extend along the length of the lower support structure 112. The legs 182 and/or members 183, for example, may be structural shapes (e.g., square tubing, I-beams, or the like) made of 8020 steel. It may be noted that other arrangements of legs and/or members may be used in various embodiments.

Figure 6:
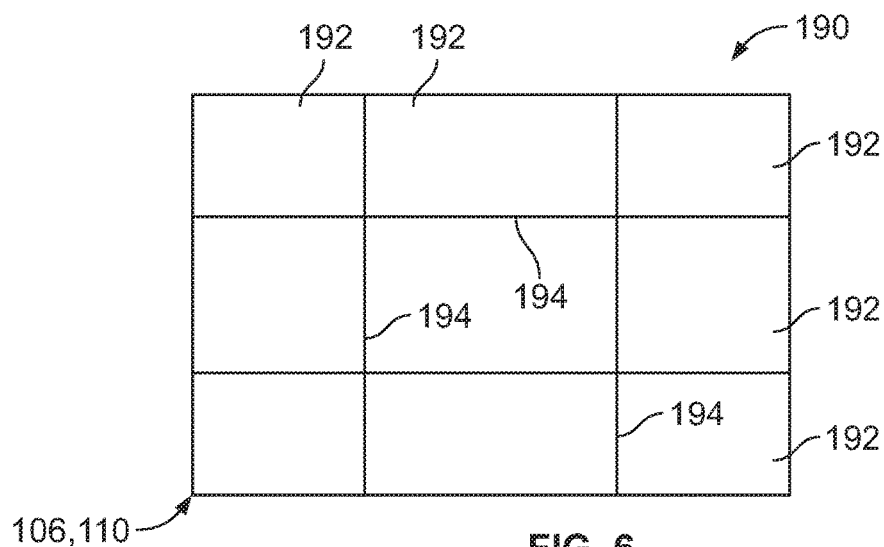
FIG. 6 provides a plan view of a composite plate, according to an embodiment of the present disclosure.
Figure 7:
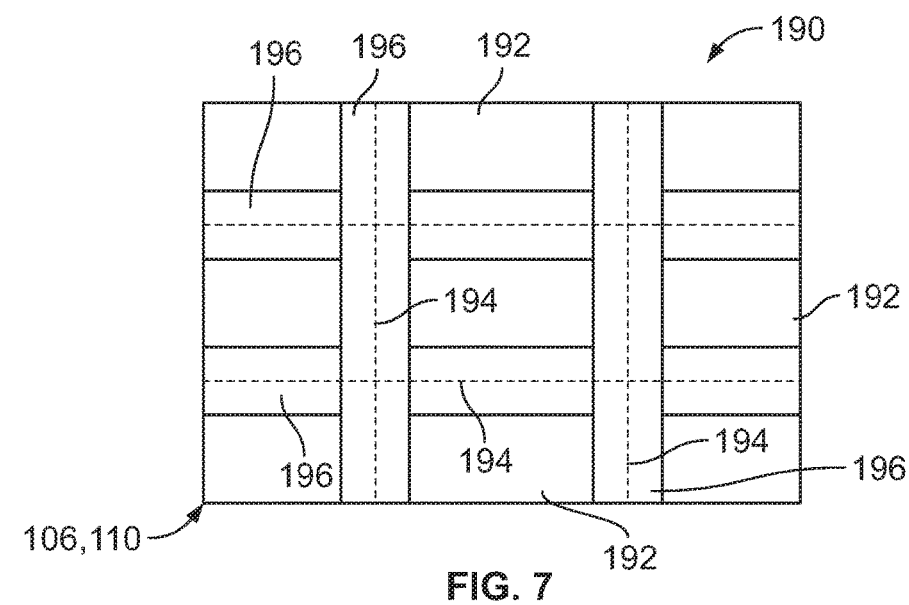
FIG. 7 provides a view of the composite plate of FIG. 6 that includes conductive tape disposed along seams, according to an embodiment of the present disclosure.

It may be noted that in various embodiments, the upper plate 106 and lower plate 110 may have a relatively large area (e.g., in excess of 2000 square feet). Accordingly, to provide such a large area, a number of smaller plates may be joined to form the upper plate 106 and/or the lower plate 110. FIG. 6 provides a plan view of a composite plate 190 in accordance with various embodiments. The composite plate 190 may be used as an upper plate 106 and/or a lower plate 110 in various embodiments. As seen in FIG. 6, the composite plate 190 includes a plurality of member plates 192. For example, the member plates 192 may be abutted next to each other to form a solid composite plate 190. The member plates 192 in the illustrated example define seams 194 where joined to adjacent member plates 192. In various embodiments, the seams 194 may be covered (e.g., on an interior side of the member plate 192 oriented toward an interior of the TEM test space 118) to provide a smooth surface. The composite plate 190 depicted in FIG. 7 includes conductive tape 196 disposed along the seams 194 (the seams 194 are shown in dashed lines in FIG. 7). The use of composite plates in various embodiments allows for use of easier to handle, acquire, and/or transport smaller individual plates to form a larger a plate, while use of the conductive tape 196 helps to avoid or minimize any discontinuities on the face of a plate that may affect TEM performance.

Figure 8:
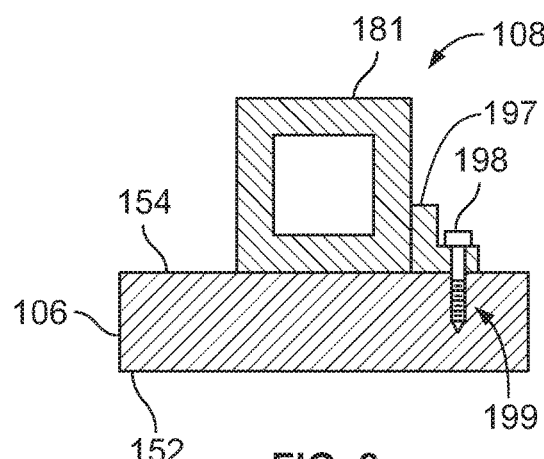
FIG. 8 provides a side sectional view of an upper plate and upper support structure, according to an embodiment of the present disclosure.

While conventional mounting approaches typically use through holes in conjunction with fasteners, it may be noted that various embodiments, in contrast to conventional approaches for joining structures, utilize blind or tapped holes. For example, FIG. 8 provides a side sectional view of a portion of an example upper support structure 108 that is mounted to an example upper plate 106 using blind or tapped holes. As seen in FIG. 8, a member 181 of the upper support structure 108 is joined to the upper plate 106 using a screw 198 that is accepted by a tapped hole 199. The tapped hole 199 extends into the first outer surface 154 of the upper plate 106, but not entirely through the upper plate 106. In the example illustrated in FIG. 8, the upper support structure 108 includes a clip 197 that is attached to the member 181, with the screw 198 passing through an opening in the clip 197 to secure the member 181 to the upper plate 106. Accordingly, the upper support structure 108 is joined securely to the upper plate 106 without causing any surface disruption on the first inner surface 152 of the upper plate, avoiding any resulting discontinuities from such a surface disruption and improving TEM performance. It may be noted that a similar mounting arrangement using tapped holes may also be used for mounting the lower support structure 112 to the lower plate 110.

Figure 9:
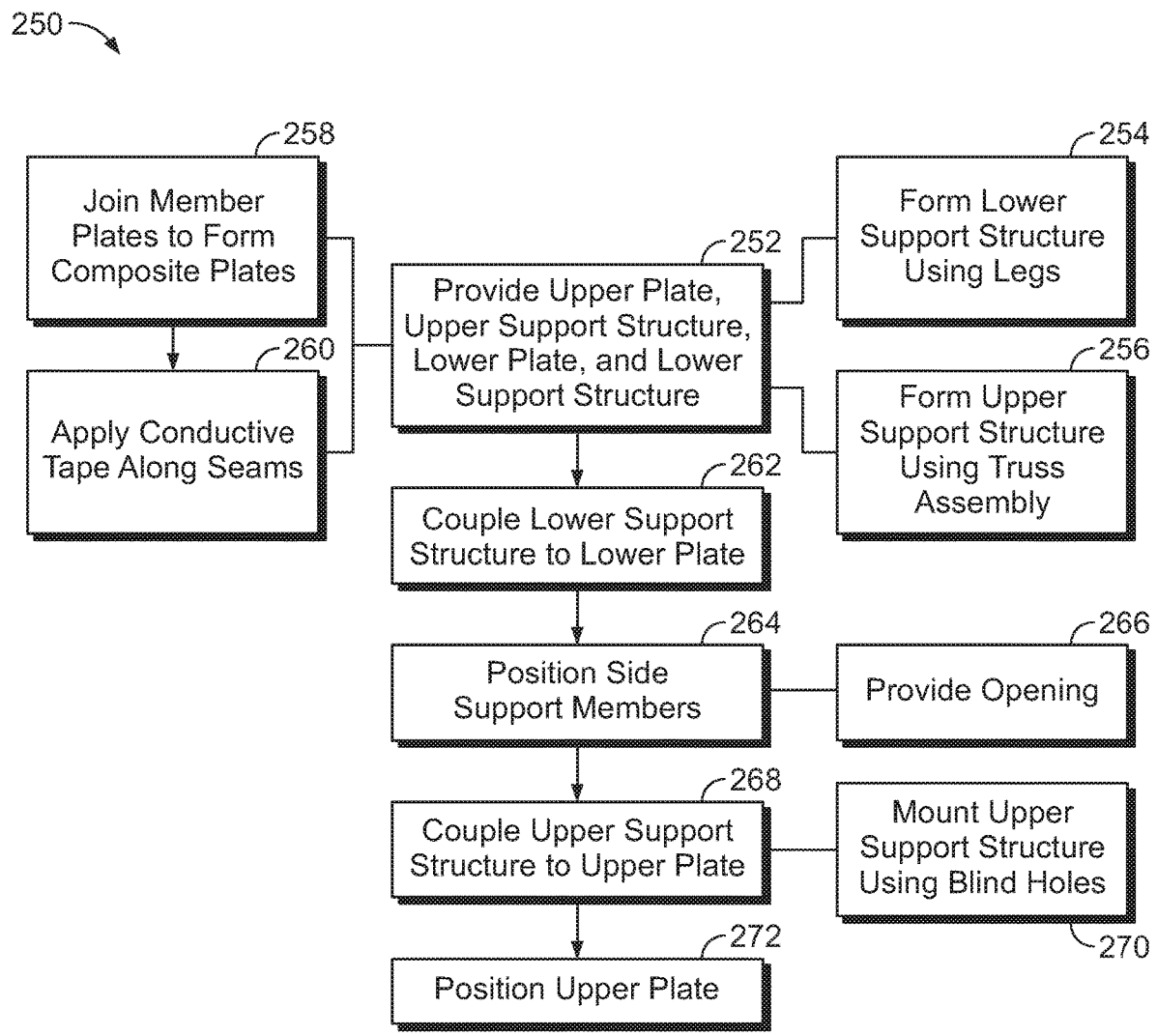
FIG. 9 is a flow chart illustrating a method to manufacture a support frame for a TEM system according to an embodiment of the present disclosure.

FIG. 9 provides a flowchart of a method 250 in accordance with an embodiment. The method 250 may be carried out in conjunction with or performed using assemblies and/or processes as set forth herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion.

At 252, an upper plate (e.g., upper plate 106), upper support structure (e.g., upper support structure 108), lower plate (e.g., lower plate 110), and lower support structure (e.g., lower support structure 112) are provided. Generally, the upper plate and lower plate are configured to define upper and lower boundaries of a TEM test space (e.g., TEM test space 118), and the upper and lower support structures are configured to provide support and rigidity to their corresponding plates. In some embodiments, for example, individual legs may be used to form the lower support structure (e.g., by joining each leg separately to the lower plate), and a truss assembly may be utilized for the upper support structure. In the depicted embodiment, at 254, the lower support structure is formed using legs (e.g., legs 182), and, at 256, the upper support structure is formed with a truss assembly (e.g., by joining members 181 together to form truss assembly 180).

As discussed herein, in various embodiments, the upper and lower plates (106, 110) may be composite plates. In the depicted embodiment, at 258, member plates are joined together to form each of the upper and lower plates (106, 110) as composite plates. Further, at 260 conductive tape is applied along seams formed between adjacent member plates. Applying the conductive tape along the seams (e.g., on the inner surfaces of the plates) improves the continuity of the inner surfaces, thereby improving TEM testing performance relative to an apparatus with exposed seams presenting surface disruptions or irregularities.

At 262, the lower support structure is coupled to the lower plate. The lower plate defines a second inner surface and an opposed second outer surface. The second inner surface is configured to be oriented toward the TEM test space. The lower support structure extends from the second outer surface of the lower plate. For example, individual legs may be joined to the second outer surface of the lower plate.

At 264, side support members (e.g., side support members 114) are positioned above the second inner surface of the lower plate proximate a periphery of the test space. For example, the side support members may include a series of foam blocks, having a height that is the desired height of the test space, that are placed around the perimeter of a footprint defined by the lower plate. The blocks may be positioned to be generally adjacent to or abutting each other around the perimeter of the lower plate or the periphery of the test space. It may be noted that the footprint may define a tapered width as discussed herein. In various embodiments, while most of the side support members may be adjacent or abutting each other, an opening for access to the test space may be provided. In the illustrated embodiment, at 266, an opening (e.g., opening 134) is provided through the side support members along the periphery of the test space. For example, two blocks may be positioned with a space between them, with the size of the space setting the width of the opening. The opening may be located proximate the object side as discussed herein.

At 268, the upper support structure is coupled to the upper plate. As discussed herein, the upper plate defines a first inner surface (configured to be oriented toward the TEM test space) and an opposed first outer surface (configured to be oriented away from the TEM test space), with the upper support structure extending from the first outer surface of the upper plate. In the illustrated embodiment, the upper support structure is coupled to the upper plate using blind holes that do not extend through the upper plate. At 270, the upper support structure is mounted to the upper plate with screws accepted by tapped holes that extend into the first outer surface but not entirely through the upper plate.

At 272, the upper plate is positioned above the side support members with the first inner surface oriented toward the second inner surface of the lower plate and toward the TEM test space. The TEM test space is defined between the first inner surface of the upper plate and the second inner surface of the lower plate. The TEM test space is also contained within an interior of a perimeter defined by the side support members. With the upper plate in place, a TEM support frame is assembled. Other components (e.g., TEM test wave source/receiver, shielding components, object to be tested) may next be disposed in or around the support frame for performance of tests.

In various embodiments, an RF absorbing structure 126 (which may include one or more individual structures or sub-assemblies) is provided to shield an area surrounding the TEM system 100. In particular, a portion of the TEM system 100, in the exemplary embodiment, may be fabricated using the support frame 103 described above. Accordingly, the RF absorbing structure 126 is utilized to reduce or eliminate EM waves that may be reflected outside the TEM test space 118 that is defined by the support frame 103. Aspects of the RF absorbing structure 126 may be located outside of the TEM test space 118 (e.g., around a perimeter or periphery defined by the support frame 103) and/or inside of the TEM test space 118 (e.g., located in the object side 122 with the object 204 nearer the source 136 than the absorbing structure(s).

Figure 10:
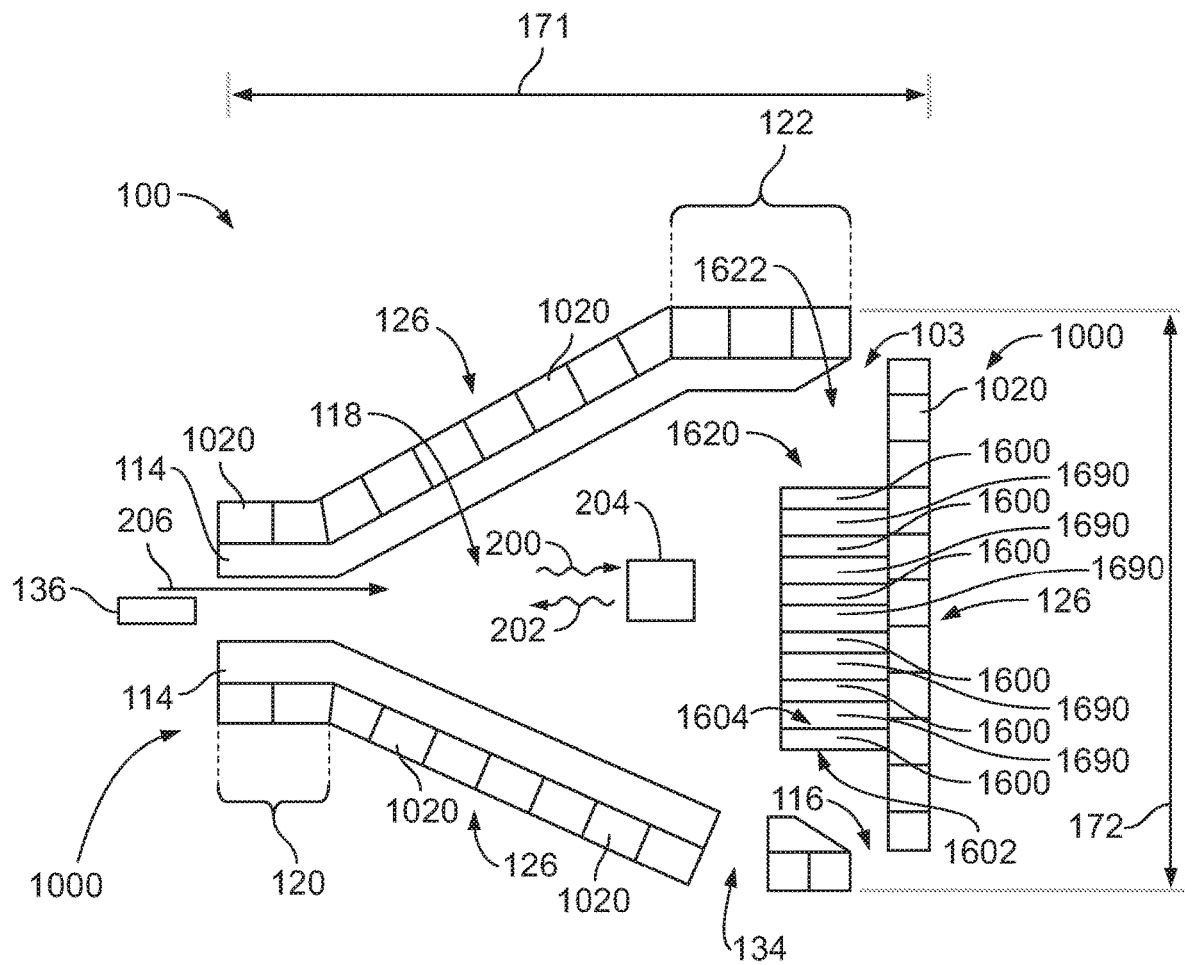
FIG. 10 is a plan view of a TEM system including an assembly including an RF absorbing structure according to an embodiment of the present disclosure.

FIG. 10 provides a plan view of the TEM system 100 including a structural assembly 1000, with the structural assembly 1000 including the support frame 103 (the upper plate 106 is removed in FIG. 10) and the RF absorbing structure 126 in accordance with various embodiments.

As seen in FIG. 10, in the illustrated example, the RF absorbing structure 126 includes a plurality of blocks 1020 that are distributed around the perimeter of the support frame 103. It may be noted that the side support members 114 are depicted as being a generally continuous structure for ease of illustration in FIG. 10, but, as discussed herein, may include a series of blocks.

Generally, the blocks 1020 are used to support one or more resistive sheets (or impedance sheets) such as the resistive sheets 1010 described below. The resistive sheets are configured to reduce the effects of interference and/or scattering during TEM testing.

Figure 11:
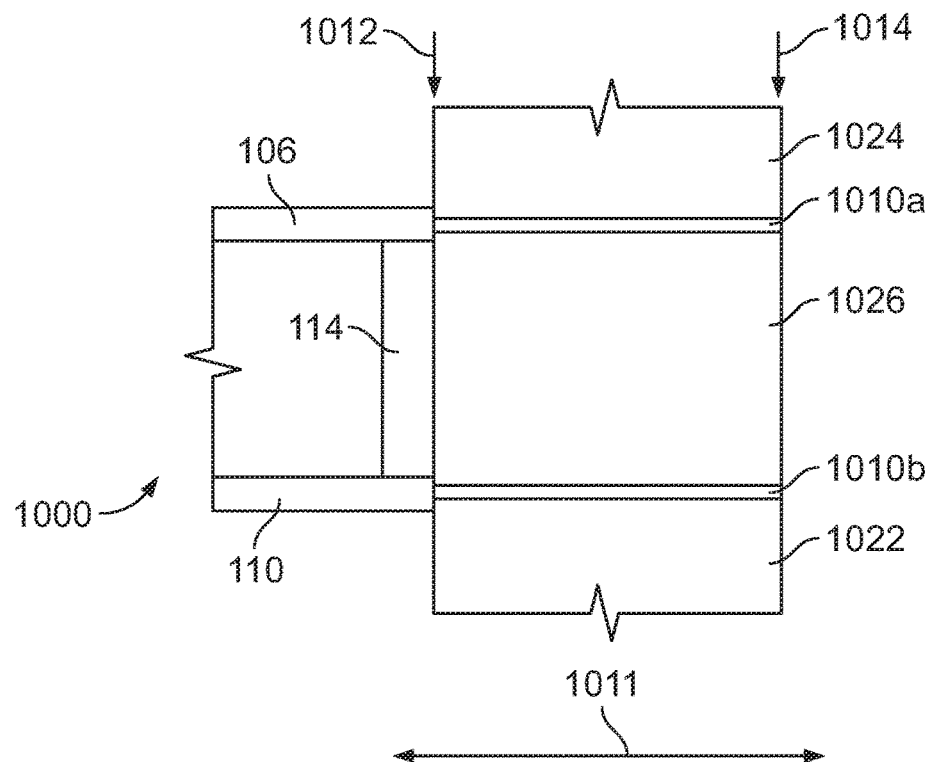
FIG. 11 is a side view of upper and lower resistive sheets according to an embodiment of the present disclosure.

Resistive sheets 1010 are provided in various embodiments for the upper plate 106 and lower plate 110. FIG. 11 provides a side view of the use of resistive sheets 1010a, 1010b with both upper and lower plates (106, 110) in accordance with various embodiments. As seen in FIG. 11, the resistive sheets 1010 include an upper resistive sheet 1010a that is coupled to the upper plate 106, and a lower resistive sheet 1010b that is coupled to the lower plate 110. Accordingly, resistive sheets 1010a, 1010b may be used to help smoothly dissipate current or energy from both the upper plate 106 and the lower plate 110.

Blocks 1020 are used to support and maintain the resistive sheets 1010a, 1010b in their desired positions and orientations. In FIG. 11, a single stack of blocks 1020 are shown; however, it may be noted that a series or plurality of such blocks may be disposed around an exterior of the support frame 103 as shown in FIG. 10.

As seen in FIG. 11, the RF absorbing structure 126 comprises a lower block portion 1022, an upper block portion 1024, and an intermediate block portion 1026. The block portions in various embodiments are made of electrically insulating foam. The upper resistive sheet 1010a is interposed between the upper block portion 1024 and the intermediate block portion 1026, and the lower resistive sheet 1010b is interposed between the lower block portion 1022 and the intermediate block portion 1026. The blocks are sized and configured to support and maintain the resistive sheets at the edges of the plates in accurate alignment and at a predetermined orientation (e.g., extending generally parallel from the plates).

Figure 12:
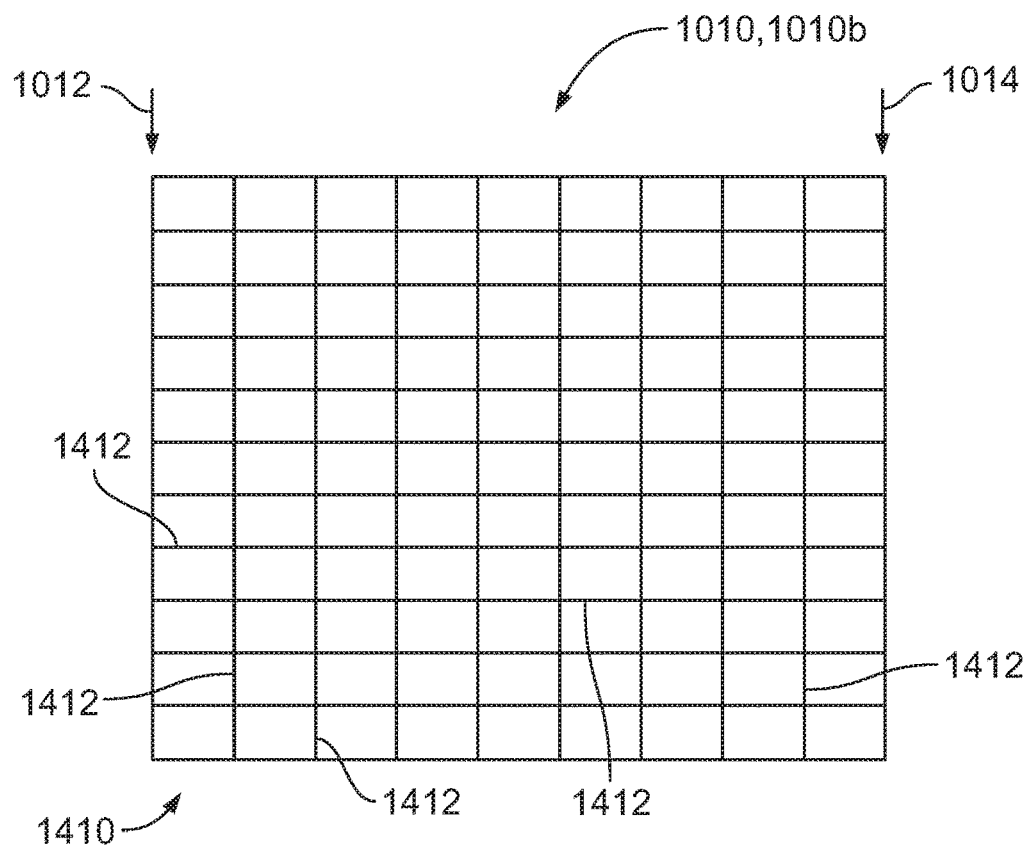
FIG. 12 is a plan view of a printed side of a resistive sheet according to an embodiment of the present disclosure.

Generally, the resistive sheets 1010a, 1010b are in electrical communication with the upper plate 106 and/or lower plate 110 and configured to help smoothly dissipate current from the plates. In FIG. 12, the resistive sheets 1010a, 1010b are shown at the same elevation as the corresponding plates 106, 110 for ease of illustration; however, in various embodiments the resistive sheets 1010a, 1010b may be at a different elevation (e.g., a bottom surface of the resistive sheet 1010a, 1010b aligned with an upper surface of the corresponding plate 106, 110, or an upper surface of the resistive sheets 1010a, 1010b aligned with a bottom surface of the corresponding plate 106, 110.

In various embodiments, the resistive sheets 1010a, 1010b extends parallel (e.g., within 5% of parallel) to the corresponding upper or lower plate 106, 110 from an exterior of the support frame 103. The resistive sheets 1010a, 1010b are supported by and maintained in a desired position by blocks 1020 disposed above and below the resistive sheets. The resistive sheets 1010a, 1010b have an inner end 1012 that is disposed proximate to the corresponding upper or lower plate 106, 110, and also have an outer end 1014 that is disposed opposite the inner end 1012, with the outer end 1014 at a maximum distance from the corresponding upper or lower plate 106, 110. The resistive sheets 1010a, 1010b have a variable resistance along a length 1011 of the resistive sheets 1010a, 1010b extending from the inner end 1012 to the outer end 1014. The variable resistance is greater at the outer end 1014 than at the inner end 1012. The variable resistance in the illustrated embodiment varies proportionally to distance along the length 1011. Utilization of a variable resistance that is larger at the outer end 1014 provides for dissipation of current or energy passing from the upper or lower plates while providing for a smooth transition in increase in resistance, and accordingly reducing the effects of scattering or background effects on TEM test results.

Figure 13A:
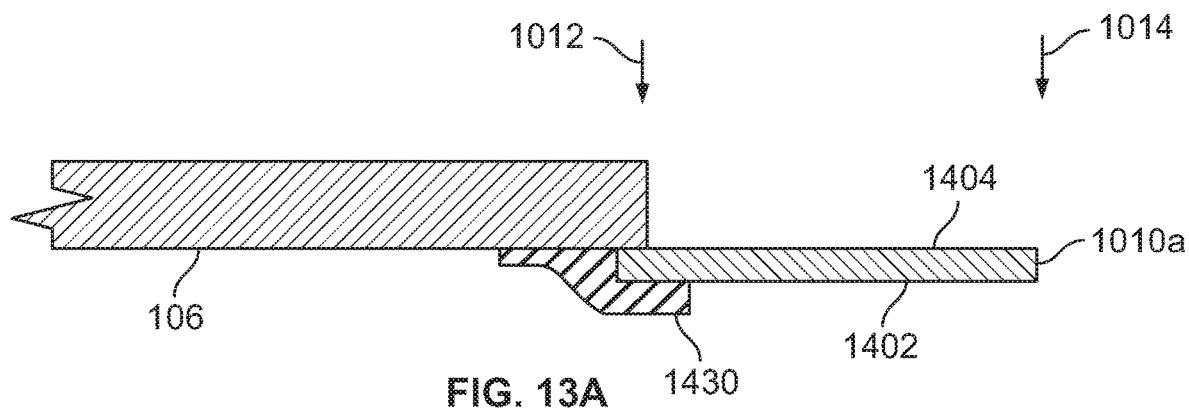
FIG. 13a is a side view of a resistive sheet of FIG. 12 mounted to an upper plate.
Figure 13B:
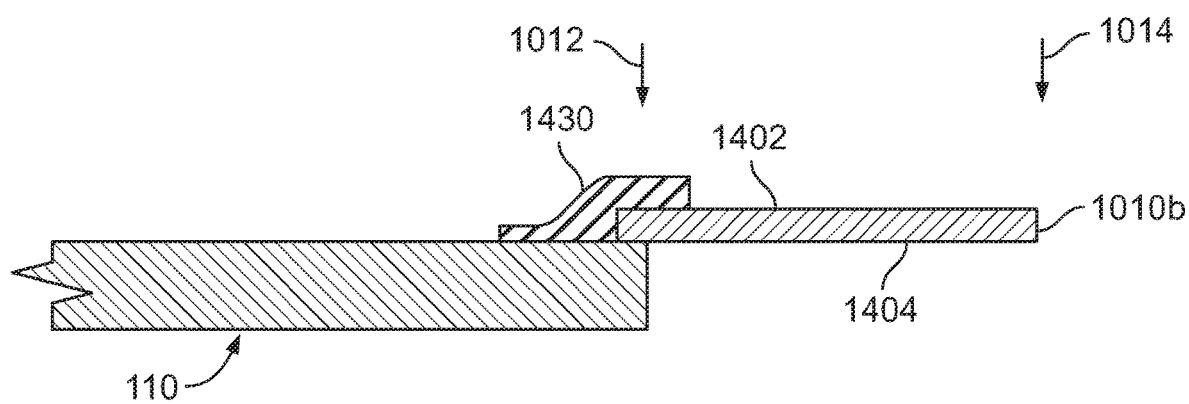
FIG. 13b is a side view of a resistive sheet of FIG. 12 mounted to a lower plate.

As discussed herein, the resistive sheets 1010a and 1010b have a variable resistance that is greater at the outer end 1014. FIG. 12 provides a plan view of resistive sheet 1010a, 1010b in accordance with various embodiments, FIG. 13a provides a side view of the resistive sheet 1010a mounted to a corresponding upper plate 106, and FIG. 13b provides a side view of the resistive sheet 1010b mounted to a corresponding lower plate 110. The resistive sheets 1010a, 1010b include a resistive side 1402 and a substrate side 1404. Generally, the resistive side 1402 includes a resistive material that has been disposed on an electrically insulating substrate. Accordingly, the printed side 1402 is resistive and the substrate side 1404 is insulating.

In the illustrated example, the depicted resistive sheets 1010a, 1010b include a grid 1410 of resistive portions (e.g., traces) 1412 that are configured to provide the variable resistance. Specifically, the grid 1410 has less resistive portions 1412 proximate the inner end 1012 than the outer end 1014. Put another way, the grid 1410 is more resistive proximate the outer end 1014. It may be noted that the grid 1410 of the illustrated example includes generally parallel and perpendicular traces 1412 for ease of illustration; however, the traces 1412 may form other geometric patterns to provide the variable density of printed conductive material and resulting variable resistance.

As seen in FIGS. 13a and 13b, for the illustrated example, the resistive side 1402 is oriented away from the corresponding upper or lower plate 106, 110 to which the resistive sheet 1010a, 1010b is coupled, and the substrate side 1404 is oriented toward the corresponding plate 106, 110. The depicted resistive sheet 1010a, 1010b is coupled to the corresponding plate 106, 110 with conductive tape 1430 (e.g., copper tape). The conductive tape 1430 is in contact with the corresponding plate 106, 110 and the resistive side 1402 of the resistive sheet 1010a, 1010b, thereby electrically coupling the resistive sheet 1010a, 1010b to the corresponding plate 106, 110 even though the resistive side 1402 is oriented away from the corresponding plate 106, 110. It may be noted that other orientations (e.g., resistive side 1402 oriented toward the corresponding plate) and/or mountings may be utilized in other embodiments.

With returned reference to FIG. 10, as also discussed previously, the support frame 103 defines a length 171 that extends from the source side 120 toward the object side 122, and a width 172 that extends normal or perpendicular to the length 171. The depicted RF absorbing structure 126 further includes a plurality of resistive blocks 1600. As described above, the blocks 1020, including the resistive sheets 1010a, 1010b, are generally disposed along the sides of the support frame 103. In this embodiment, the resistive blocks 1600 are generally disposed along the width 172 proximate the object side 122. The resistive blocks 1600 are disposed behind the object to be tested 204 along the propagation direction 206 as shown in FIG. 10, and help dissipate or absorb energy to reduce background effects on TEM testing. For example, the resistive blocks 1600 may be configured to absorb EM waves that propagate to the back of the test space 118.

Figure 14:
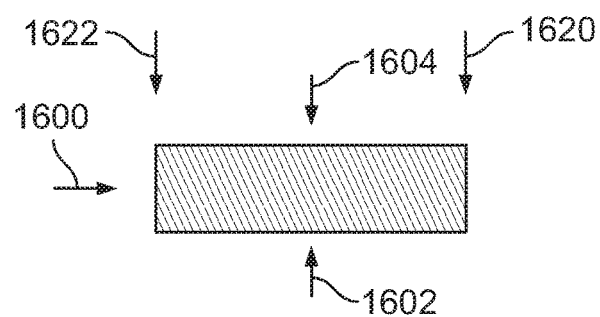
FIG. 14 is a plan view of a resistive block according to an embodiment of the present disclosure.
Figure 15:
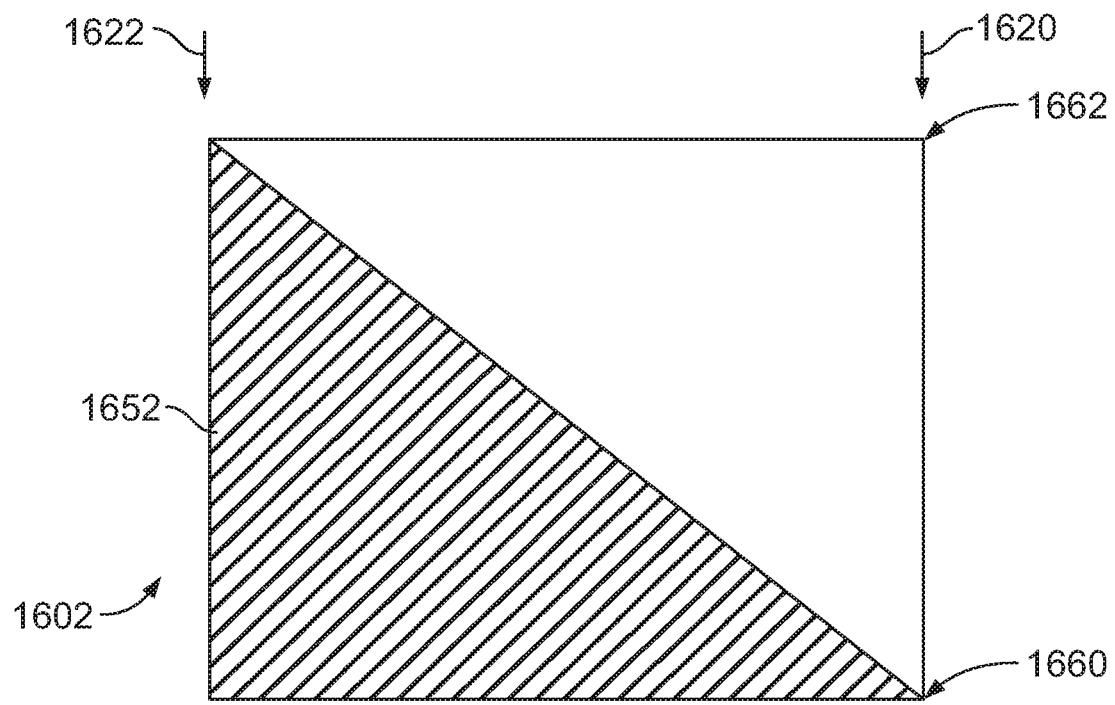
FIG. 15 is a side view of a resistive block according to an embodiment of the present disclosure.
Figure 16:
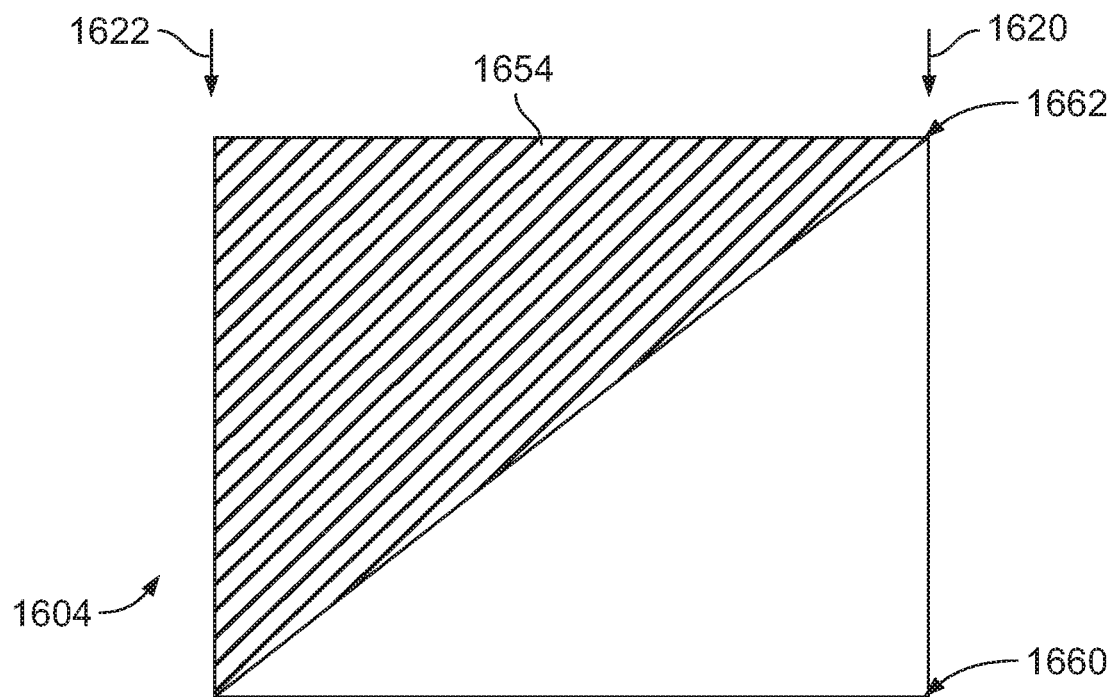
FIG. 16 is a side view of the opposite side of the resistive block of FIG. 15.

As seen in FIGS. 14-16, in the illustrated examples, each resistive block 1600 is made of an electrically insulating material, but includes resistive material disposed on a first resistive side 1602 and second resistive side 1604. For example, the resistive block 1600 may include a foam block with R cards disposed on the first resistive side 1602 and the second resistive side 1604. Other structures may be used in other embodiments to provide the resistive blocks 1600. The first resistive side 1602 and second resistive side 1604 are opposed to each other, and disposed on opposite sides of the corresponding resistive block 1600 along the width 172. The resistive blocks 1600 are disposed behind the object 204 along the propagation direction 206 to absorb energy that passes the object 204 and inhibit reflection of energy. It may be noted that when resistive blocks 1600 are used in conjunction with resistive sheets 1010 discussed herein, the resistive blocks 1600 may be placed within the test space 118 and be used to control a field strength for testing, while the resistive sheets 1010 may be disposed outside of the test space 118 and used to reduce scattering or background effects.

FIG. 14 provides a plan view of a resistive block, FIG. 15 provides a side view of the resistive block 1600 showing the first resistive side 1602, and FIG. 16 provides a side view of the resistive block showing the second resistive side 1604. The depicted resistive blocks 1600 have a front end 1620 and a rear end 1622. The front end 1620 is closer to the source side 120 than is the rear end 1622. In various embodiments, the first resistive side 1602 and second resistive side 1604 have a variable resistance that is greater at the rear end 1622 than at the front end 1620. Accordingly, with the front end 1620 receiving energy from the source 136 first, and the rear end 1622 having greater resistance, a smooth transition from lower to higher resistance is achieved.

Various configurations of resistive material disposed on the sides of the resistive blocks 1600 may be utilized to provide variable resistance (e.g. resistance that varies proportionally with length from the front end 1620 to the rear end 1622. For example, as seen in FIG. 15, the first resistive side 1602 (which may be formed by mounting an R card to the side of the block 1600) includes a first geometrically tapered resistive member 1652. The first tapered resistive member 1652 is tapered toward a bottom 1660 of the resistive block 1600. In the illustrated embodiment, the first tapered resistive member 1652 is formed as a triangle of resistive material having a maximum width at the rear end 1622 (for highest relative resistance) tapering to an end point at the bottom 1660 of the resistive block (for lowest relative resistance. Further, in the illustrated embodiment, the second tapered resistive member 1654 is formed as a triangle of resistive material having a maximum width at the rear end 1622 (for highest relative resistance) tapering to an end point at the top 1662 of the resistive block (for lowest resistance). Accordingly, with more resistive material at the front end 1620, the resistance is greater at the rear end 1622. Further, with first resistive side 1602 tapering toward the bottom 1660 and the second resistive side tapering toward the top 1662, the direction of tapering resistance tends to average toward the middle of the resistive blocks 1600, or parallel to the upper plate 106 and lower plate 110.

In some embodiments, the resistive blocks 1600 may be separated by gaps. In the illustrated embodiment, the gaps between the resistive blocks 1600 are filled by intermediate blocks 1690 that are interposed between the resistive blocks 1600. For example, an intermediate block 1690 may be interposed between pairs of neighboring resistive blocks 1600 so that resistive blocks 1600 and intermediate blocks 1690 alternate along the width 172. In various embodiments, the resistive blocks 1600 may abut adjacent intermediate blocks 1690. The intermediate blocks 1690, for example, may have a predetermined width that is selected to space resistive blocks 1600 from each other at a predetermined distance while also providing improved structural stability.

Figure 17:
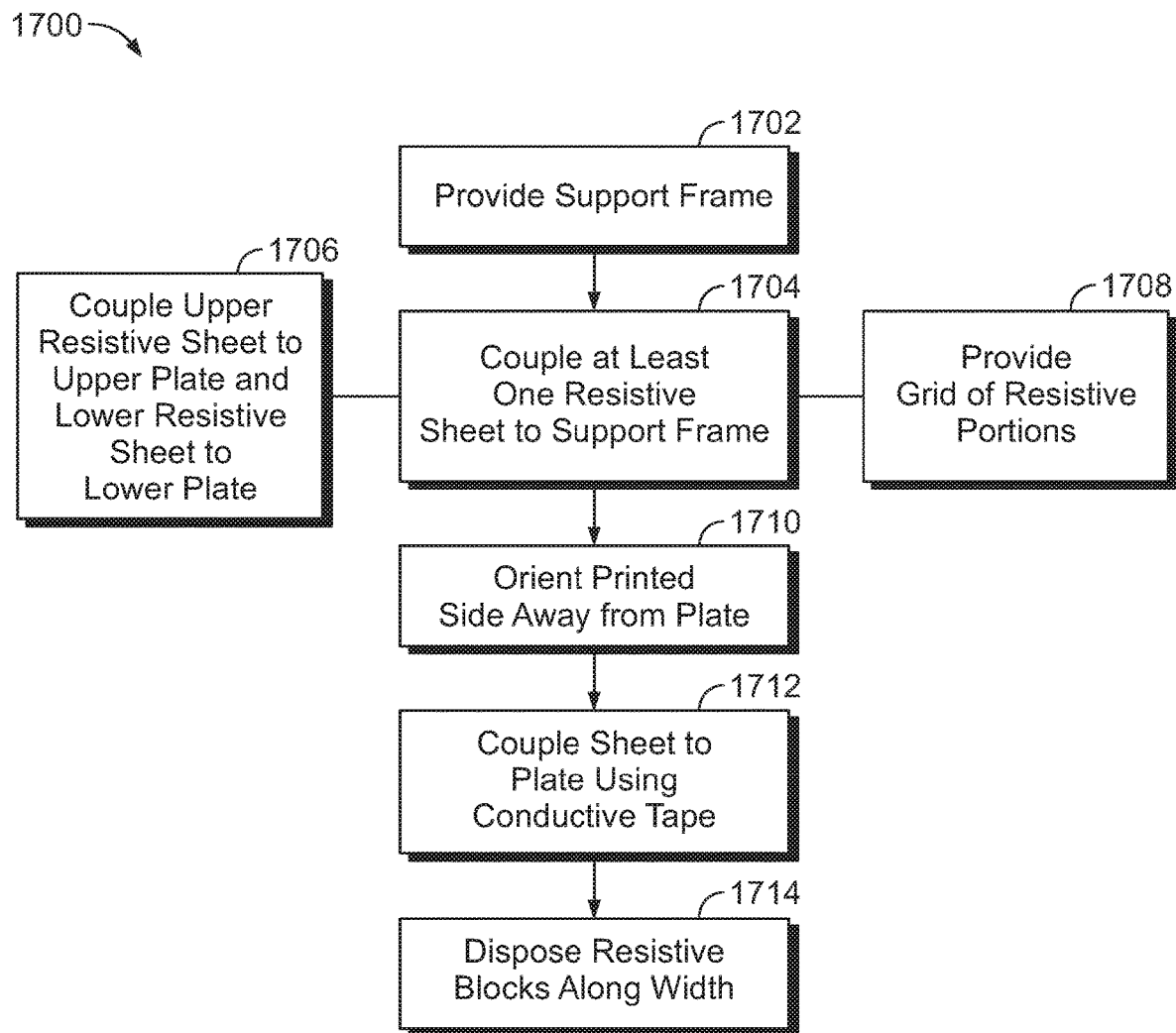
FIG. 17 is a flow chart illustrating a method to manufacture an RF absorbing structure for a TEM system according to an embodiment of the present disclosure.

FIG. 17 provides a flowchart of a method 1700 in accordance with an embodiment. The method 1700 may be carried out in conjunction with or performed using assemblies and/or processes as set forth herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion.

At 1702, a support frame (e.g., support frame 103) is provided. The support frame in various embodiments is assembled using one or more aspects of the method 250 discussed in connection with FIG. 9, and/or includes one or more aspects of the support frame 103 discussed in connection with FIGS. 1-8. For example, the support frame includes an upper plate and lower plate spaced a distance from each other to define a TEM test space, as more fully set forth in connection with FIGS. 1-9.

At 1704, at least one resistive sheet (e.g., resistive sheet 1010) is coupled to at least one of the upper plate or lower plate of the support frame. In various embodiments, the resistive sheet is electrically and mechanically coupled to the corresponding upper or lower plate, and extends parallel to the corresponding upper or lower plate from an exterior of the support frame. The resistive sheet has an inner end that is disposed proximate the corresponding upper or lower plate to which it is coupled, and an outer end opposite the inner end. The resistive sheet has a variable resistance that is greater at the outer end than the inner end.

In various embodiments, respective resistive sheets may be coupled to both upper and lower plates (106, 110). For example, in the illustrated embodiment, at 1706, an upper resistive sheet is coupled to the upper plate, and a lower resistive sheet is coupled to the lower plate. In various embodiments, upper, lower, and intermediate blocks may be used to support and/or position the resistive sheets as discussed elsewhere herein.

Various techniques may be used to provide variable resistance in various embodiments. For example, in the illustrated embodiment, at 1708, a grid of resistive portions is provided on the resistive sheet (e.g., on a resistive side of the resistive sheet that has a substrate side and resistive side). The grid may be provided as an R card in various embodiments. Further, in the illustrated embodiment, at 1710, the resistive side is oriented away from the corresponding upper or lower plate, and the substrate side is oriented toward the corresponding upper or lower plate. At 1712, the resistive sheet is coupled to the corresponding upper or lower plate with conductive tape. The conductive tape may be used to electrically couple the grid or resistive side with the corresponding upper or lower plate.

Additionally or alternatively to resistive sheets disposed around the periphery of a test space or support frame, in various embodiments resistive blocks may be used in the interior of the support frame or test space. For example, in the illustrated embodiment, at 1714, resistive blocks (e.g., resistive blocks 1600) are disposed along a width of the of the support frame in the test space proximate an object side of the support frame. Each resistive block has a first resistive side and a second resistive side opposed to each other and oriented along the width. The resistive sides, for example, may have a variable resistance that increases along the length of the corresponding resistive block in a direction away from a source of a wave for TEM testing. The resistive sides in various embodiments may be provided as R cards mounted to opposing sides of foam blocks.

With continued reference to FIG. 10, in various embodiments, a source 136 for the TEM system 100 may be used to help determine EM properties of object to be tested. In the example, depicted in FIG. 10, the source 136 is configured to provide an incident wave 200 toward an object 204 to be tested, with a reflected wave 202 reflected from the object 204 back toward the source 136. The source 136 may be used in connection with one or more supplies and/or processing units (not shown in FIG. 10) to receive and analyze the reflected wave 202 to determine EM properties of the object 204 using the TEM system 100.

Figure 18:
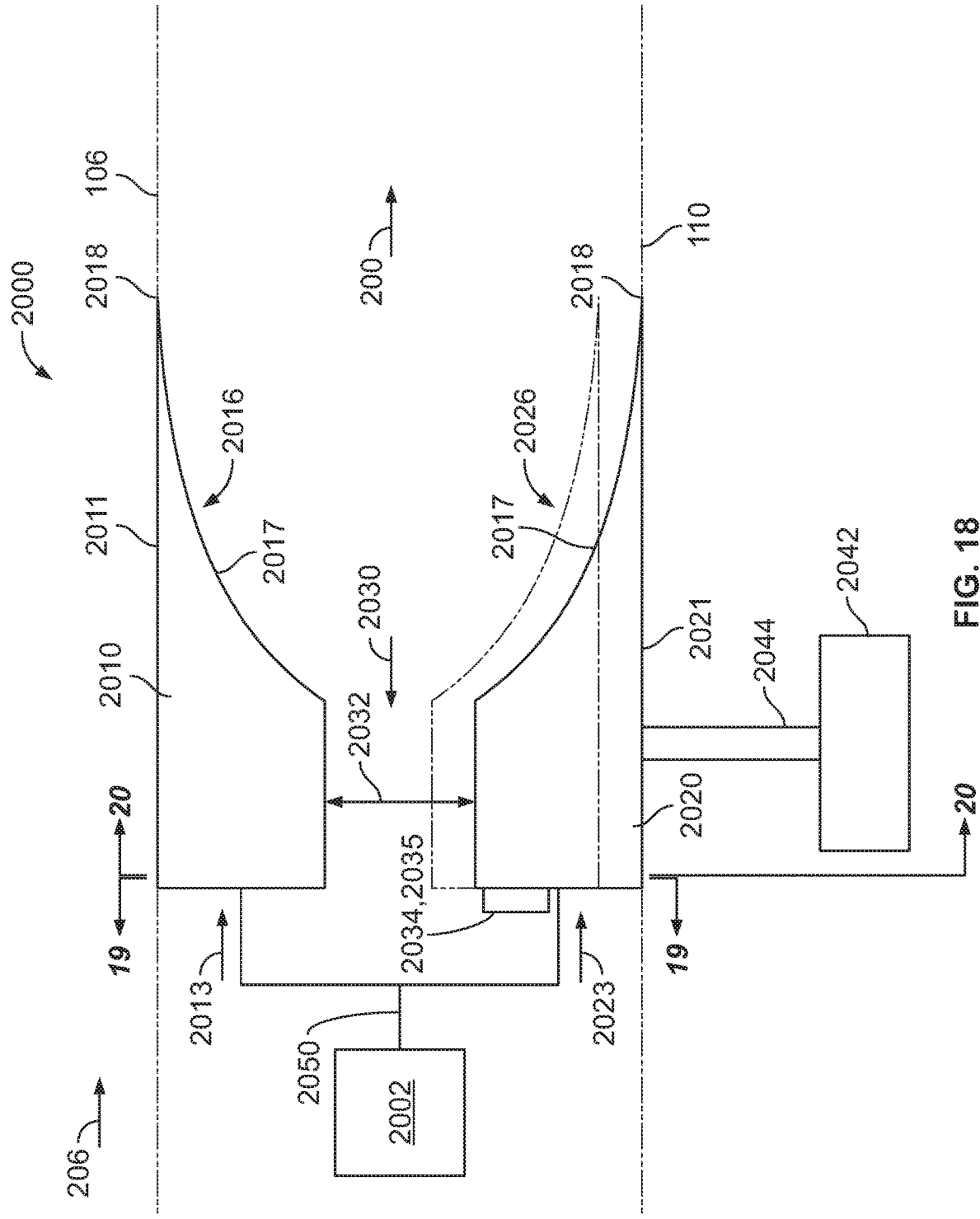
FIG. 18 is a side view of a source assembly in accordance with various embodiments.
Figure 19:
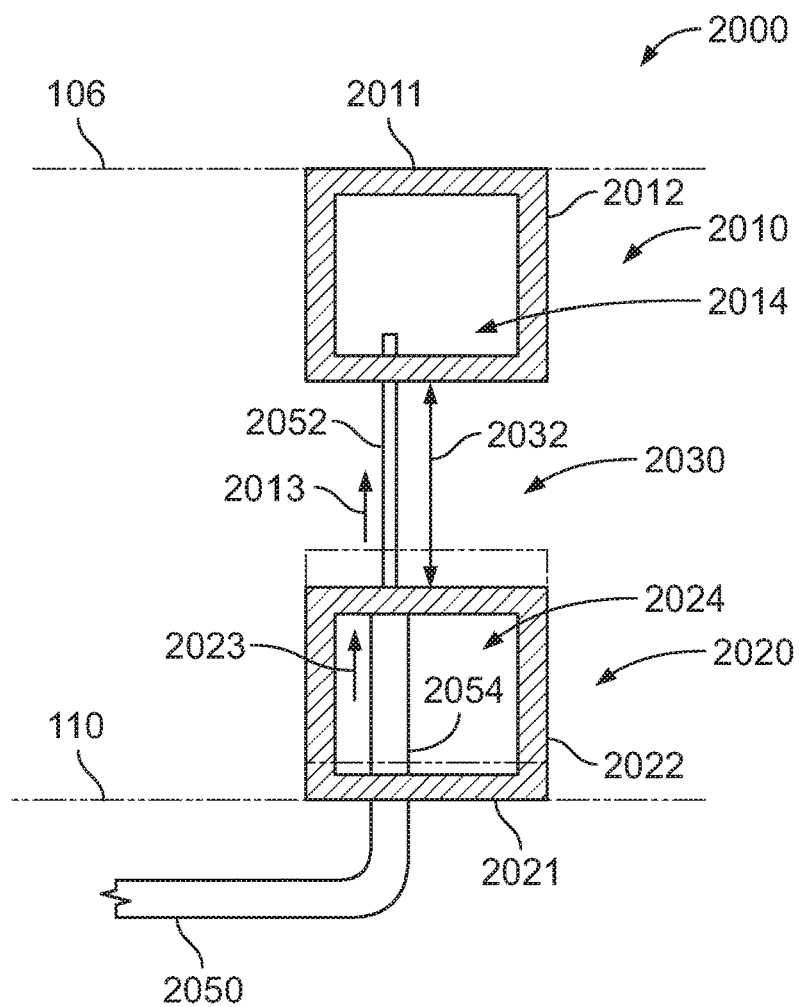
FIG. 19 is a sectional view of aspects of the source assembly of FIG. 18.

The source 136 in various embodiments utilizes a pair of conductors to transmit the incident wave 200 toward the object 204. Various embodiments discussed herein provide improved conductor pairs. For example, FIG. 18 provides a side view of an example source assembly that utilizes conductor pairs. FIG. 18 provides a side view of source assembly 2000 that is configured to generate an incident wave (e.g., incident wave 200) that utilizes a conductor pair including a first guide 2010 and a second guide 2020 in accordance with various embodiments. FIG. 19 includes a sectional view taken across lines 19-19 of the first guide 2010 and second guide 2020. The source assembly 2000 is coupled to a supply 2002. In the illustrated embodiment, supply 2002 is configured as a data processing device and power supply unit including at least one processor configured to control the supply of current to the first guide 2010 and second guide 2020 to transmit the incident wave 200, as well as to utilize the reflected wave 202 to determine EM properties of the object 204. It may be noted that the depicted supply 2002 is shown as a single block for ease of illustration; however, in practice the supply 2002 may be split among multiple physical blocks, entities, systems, or components.

In the illustrated embodiment, the first guide 2010 is configured to receive a signal 2013 from the supply 2002. The first guide 2010 includes a first shell 2012 defining a first cavity 2014. The first guide 2010 is configured to extend proximate the upper plate (e.g., upper plate 106) of a TEM system. For example, the first guide 2010 may extend along an inner surface of the upper plate 106 as shown in FIG. 18. The first guide 2010 is made of an electrically conductive material and is electrically coupled to the upper plate 106.

Generally similarly, the second guide 2020 is configured to receive a reference signal 2023 from the supply 2002. The second guide 2020 includes a second shell 2022 that defines a second cavity 2024. The second guide 2020 is configured to extend proximate the lower plate (e.g., lower plate 110) of a TEM system. For example, the second guide 2020 may extend along an inner surface of the lower plate, or as another example, the second guide 2020 may extend along a recess or slot of the lower plate. The second guide 2020 is made of an electrically conductive material and is electrically coupled to the lower plate.

As seen in FIGS. 18 and 19, the second guide 2020 is spaced a distance from the first guide 2010 to define a gap 2030 having a gap width 2032 (corresponding to the distance). In various embodiments, at least one of the first guide 2010 or second guide 2020 comprises an access opening 2034 that is configured to provide access to at least one of the first cavity 2014 or the second cavity 2024. In the illustrated embodiment the access opening 2034 is provided through a wall of the second shell 2022 proximate the supply 2002, and is schematically depicted as a hinged door 2035 (shown closed in FIG. 18). The access opening 2034, for example, provides access to electrical components (e.g., cables) and/or mechanical components (e.g., aspects of an adjustment assembly as discussed herein) disposed within the second cavity 2024. Generally, access openings may also be used to provide access to the interior of the first shell 2012 and/or second shell 2022 for mounting and/or adjusting the positions of the first guide 2010 and/or second guide 2020. The first guide 2010 and second guide 2020 extend generally parallel to each other and their corresponding plates to which they are mounted. For example, in the illustrated embodiment, the first guide 2010 includes a base 2011 that extends parallel to the upper plate 106, and the second guide 2020 includes a base 2021 that extends parallel to the lower plate 110.

In various embodiments, the first and second guides 2010 and 2020 are shaped to help produce smooth transitions (e.g., changes in shape along the propagation direction 206) for improved TEM testing performance. For example, in the illustrated embodiment, as best seen in FIG. 18, the first guide 2010 has a first tapered side 2016 and the second guide 2020 has a second tapered side 2026 oriented toward each other. The first tapered side 2016 and second tapered side 2026 each include or define a taper 2017 that continuously reduces in slope toward an end point 2018 oriented toward an object to be tested. The continuous reduction in slope allows for a smooth transition to the ends of the guides as the guides reach their ends.

In the illustrated embodiment, as shown in FIG. 19, the source assembly 2000 includes a coaxial source cable 2050. Generally the coaxial source cable 2050 is configured to provide signals from the supply 2002 to the guides which in turn produce signals forming the incident wave 200 responsive to receiving the signals from the supply 2002. The depicted coaxial source cable 2050 includes a center conductor 2052 and an outer conductor 2054. The center conductor 2052 and outer conductor 2054 pass through the second cavity 2024. The center conductor 2052 passes beyond the second cavity 2024 to the first guide 2010, and is coupled to the first guide 2010, with the first guide 2010 receiving the signal 2013 via the center conductor 2052. The outer conductor 2054 in the illustrated embodiment does not extend to the first guide 2010. The outer conductor 2054 is coupled to the second guide 2020, with the second guide 2020 receiving the reference signal 2023 via the outer conductor 2054.

Figure 20:
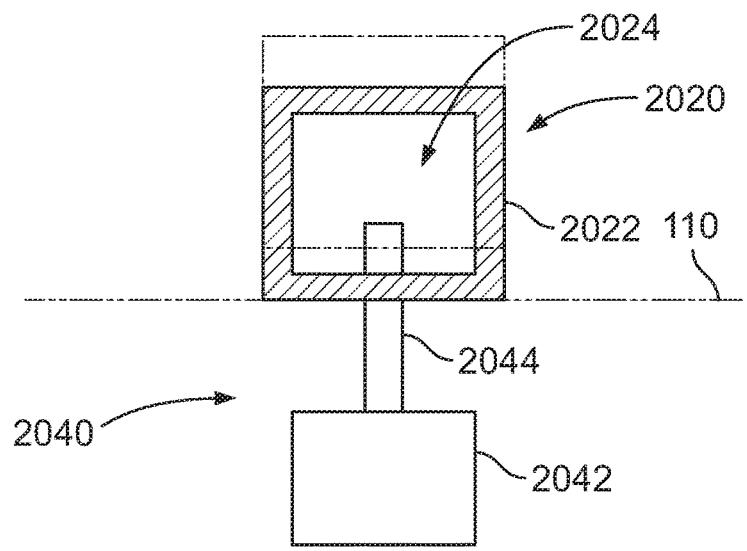
FIG. 20 is a sectional view of aspects of the source assembly of FIG. 18.

In various embodiments, an adjustment mechanism is provided that may be used to adjust the physical position and/or orientation of one or both of the first guide 2010 and/or the second guide 2020, for example, to control the input impedance of the source assembly 2000 by adjusting the gap width 2032 of the gap 2030. FIG. 20 provides a side sectional view of aspects of the source assembly 2000 taken along lines 20-20. As seen in FIG. 20, the source assembly 2000 includes an adjustment assembly 2040. In various embodiments, the adjustment assembly 2040 is coupled to at least one of the first guide 2010 or second guide 2020, and is configured to adjust a position of at least one of the first guide 2010 or second guide 2020 to adjust the gap width 2032. Accordingly, the input impedance of the source assembly 2000 may be adjusted. Alternatively or additionally, the position of the first guide 2010 with respect to the upper plate 106 and/or the position of the second guide 2020 with respect to the lower plate 110 may be adjusted. The adjustment assembly 2040 in various embodiments may include one or more of a threaded actuator rod, gears, motor, cylinder, or linkages configured to receive an input and, responsive to the input, adjust the position of the first guide 2010 and/or the second guide 2020. The input may be provided manually (e.g., turning of the threaded actuator rod, moving of a lever) and/or electronically (e.g., control signal to a motor).

In the illustrated example, the adjustment assembly 2040 is coupled to the second guide 2020, and used to adjust a height of the second guide 2020. For example, the second guide 2020 may be raised form an original position shown in solid lines to an adjusted position shown in phantom lines in FIGS. 18, 19, and 20 using the adjustment assembly 2040, to adjust the input impedance. The adjustment assembly 2040 includes a base 2042 and an adjustment portion 2044. The adjustment portion 2044 is coupled to the second guide 2020. The adjustment portion 2044 is interposed between the base 2042 and the second guide 2020, with base 2042 configured to be disposed beneath the lower plate 110. One or more aspects of the adjustment assembly 2040 (e.g., all or apportion of the adjustment portion 2044) may be disposed within the second guide 2020, with access to those aspects provided by access opening 2034.

Figure 21:
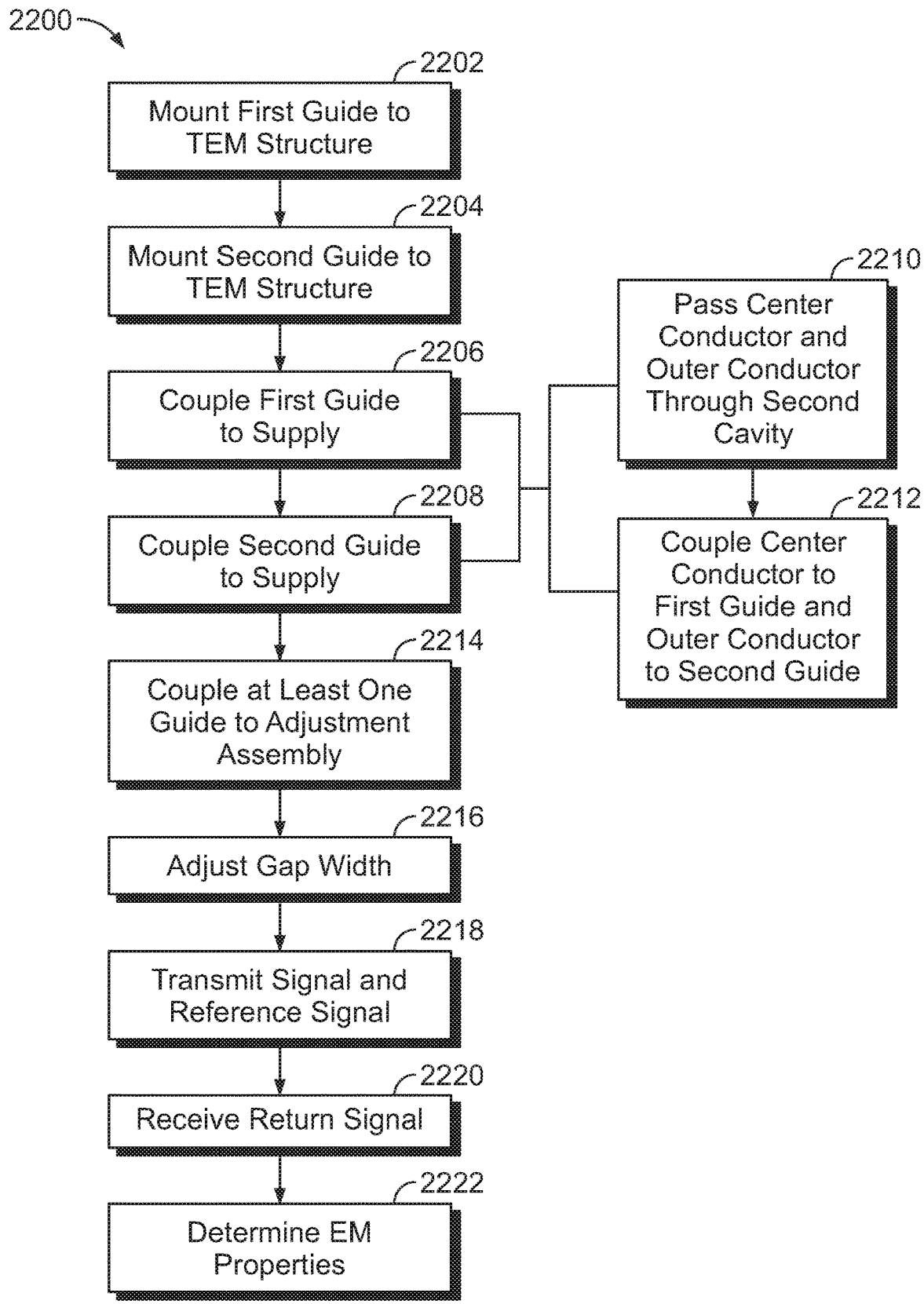
FIG. 21 is flow chart illustrating a method according to an embodiment of the present disclosure.

FIG. 21 provides a flowchart of a method 2200 in accordance with an embodiment. The method 2200 may be carried out in conjunction with or performed using assemblies and/or processes as set forth herein. For example, it may be noted that the method 2200 (or aspects thereof) may be combined with method 250 (or aspects thereof) and/or method 1700 (or aspects thereof) to provide a TEM system and/or utilize the TEM system to test an object. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion.

At 2202, a first guide (e.g., first guide 2010) is mounted to a TEM structure (e.g., support frame 103), and extends proximate an upper plate (e.g., upper plate 106) of a TEM system. The first guide includes a first shell defining a first cavity, and is electrically coupled to the upper plate.

At 2204, a second guide (e.g., second guide 2020) is mounted to the TEM structure at a distance from the first guide to define a gap having a gap width. The second guide extends proximate a lower plate (e.g., lower plate 110) of the TEM system. The second guide includes a second shell defining a second cavity, and is electrically coupled to the lower plate. At least one of the first or second guides includes an access opening (e.g., access opening 2034) that provides access to the corresponding first or second guide.

At 2206, the first guide is coupled to a supply for receiving a signal from the supply, and, at 2208, the second guide is coupled to the supply for receiving a reference signal from the supply.

At 2210, to couple the first and second guides to the supply, a center conductor and outer conductor of a coaxial source cable is passed through the second cavity of the second guide. At 2212, the center conductor is coupled to the first guide and the outer conductor is coupled to the second guide. Accordingly, in the illustrated embodiment, the first guide receives a signal from the supply via the center conductor, and the second guide receives a reference signal from the supply via the outer conductor.

At 2214, at least one of the first or second guides is coupled to an adjustment assembly (e.g., adjustment assembly 2040). For example, the adjustment assembly may include a base and an adjustment portion, with the adjustment portion coupled to the second guide. With the base disposed beneath the second guide, the adjustment portion is interposed between the base and the second guide.

At 2216, a position of at least one of the first guide or second guide is adjusted to adjust the gap width. Accordingly, the impedance of the source assembly including the first and second guides may be adjusted.

At 2218, the signal and reference signal are transmitted from a source via the first guide and second guide, respectively. The signal and reference signal are transmitted toward an object (e.g., object 204) to be tested, and may cooperate to form an incident wave (e.g., incident wave 200). The incident wave is reflected off of the object, resulting in a reflected wave or return signal being transmitted back toward the first and second guides.

At 2220, the return signal (e.g., reflected wave 202) is received (e.g., by a processing unit via the first and second guides). The return signal may then be analyzed and used, at 2222, to determine EM properties of the object being tested.

Figure 22:
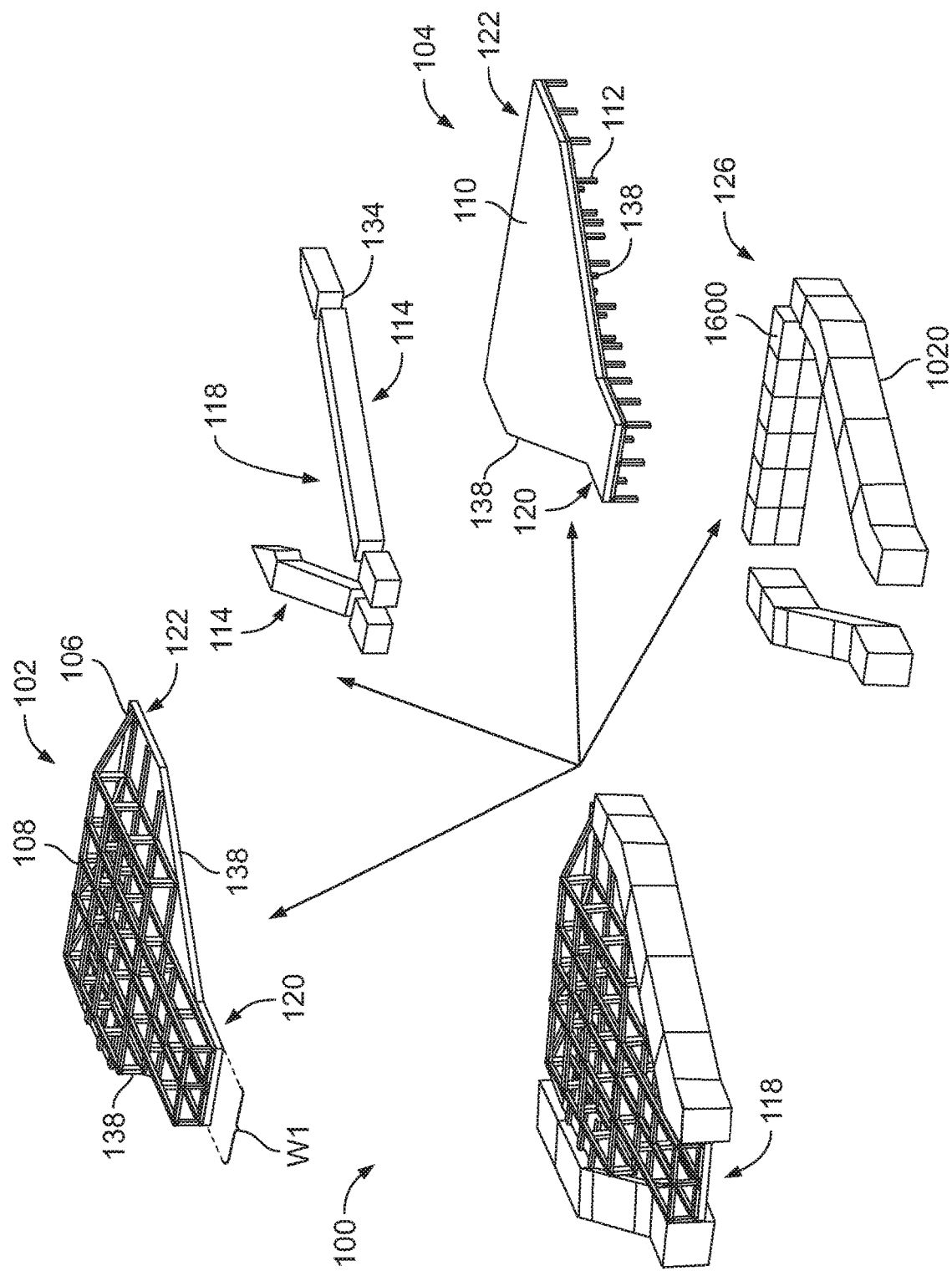
FIG. 22 is an exploded view of a TEM system according to an embodiment of the present disclosure.
Figure 23:
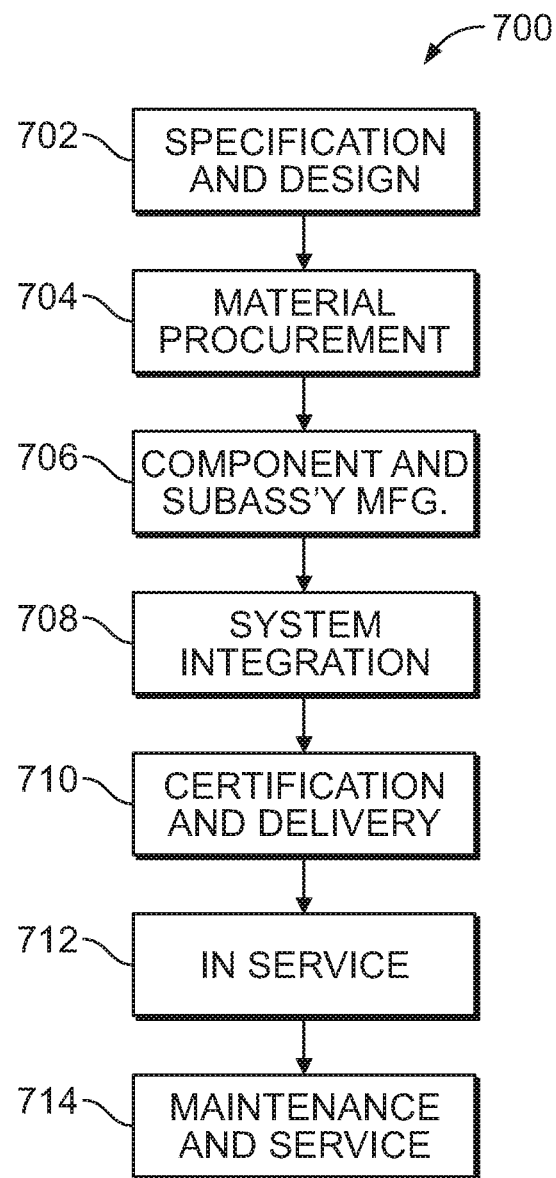
FIG. 23 is a block diagram of an aircraft production and service methodology.

As discussed herein, one or more of the aspects discussed above may be used in connection with a TEM system for testing an object 204. FIG. 10 provides a plan view of a TEM system 100 (with the upper plate removed), and FIG. 22 provides an exploded view of aspects of the TEM system 100. As seen in FIGS. 10 and 23, the depicted TEM system 100 includes the support frame 103, RF absorbing structure 126, and source assembly 2000 discussed herein. Various aspects of the support frame 103, RF absorbing structure 126, or source assembly 2000 may be omitted or modified in various embodiments. Generally, the TEM system 100 is configured in various examples for testing the EM properties of an object. The TEM system 100 includes a TEM cell 101 or parallel plate waveguide defined by the support frame 103. The TEM cell 101 provides a waveguide or transmission structure that may be utilized by the TEM system 100 for transmitting signals.

To test an object using the TEM system 100, an incident wave 200 (e.g., TEM test wave) is generated and propagates within the parallel plate waveguide and is reflected as a reflected signal 202 from an object 204 under test. As should be appreciated, the reflected signal contains information about the object 204 according to EM testing technology (e.g., EM properties, performance characteristics, etc.).

It may be noted that the guides from the source assembly 2000 may be utilized in various embodiment; however, other conductors may be used in alternate embodiments. For example, in some embodiments, any conductors capable of generating a test signal for testing the EM properties of the object 204 (e.g., a 50 MHz to 1000 MHz EM test signal) may be utilized. In various examples, the conductors utilized to transmit the incident wave 200 may be any type of TEM transmission line medium (e.g., two flat strips of metal sandwiched between two parallel ground planes.

Thus, the TEM system 100 has components that define a TEM cell having a parallel plate waveguide formed in part by the upper and lower plates (106, 110) 106, 110 that are separated by a distance that defines a gap that functions as the test space 118. It may be noted that, as discussed herein, each of the upper and lower plates (106, 110) 106, 110 in some examples are fabricated from a plurality of sectional panels that are structurally enhanced by the support structures 108, 112 that can include a plurality of I-beams or engineered shapes or extrusions, etc. that are mounted on an exterior surface of the panels that form the upper and lower plates (106, 110) 106, 110. It should be noted that in various examples, seams between the panels are aligned to extend along the propagation direction 206.

In one example, the upper and lower plates (106, 110) 106, 110 along with the upper support structure 108 and lower support structure 112 are formed from extruded Aluminum sections, and the upper and lower plates (106, 110) 106, 110 are formed from aluminum honeycomb core panels having a thickness of one inch. It may be noted that in some examples, the upper and lower plates (106, 110) 106, 110 are formed as one inch aluminum honeycomb panels and have an alodined surface to prevent oxidation. In one example, the maximum deflection of the upper structure under the weight of the TEM system 100 (16,000 pounds) is approximately 0.046 inches with a maximum deflection of the lower structure being approximately 0.018 inches.

The TEM system 100 is capable of performing one or more different tests within the test space 118 using TEM testing techniques. For example, the TEM system 100 can perform bulk material property measurements, thin impedance sheet measurements, 2D radar cross-section measurements, and antenna measurements, among others. In some examples, the TEM system 100 performs the test(s) by operating over a frequency range of 50 MHz to 1 GHz to allow implementation of time-domain gating. However, the TEM system 100 can operate at other frequencies as determined by a signal generator/receiver (e.g., source 136) coupled to the pair of shaped conductors. The signal generator/receiver can be any type of EM test signal generation and receiving device capable of generating and measuring EM signals for testing the object 204. In one example, the TEM system 100 is excited with a tapered feed/launcher allowing for broad band operation of the TEM system 100.

In some examples, the TEM system 100 operates in the dominant mode (TE1) and propagates a transverse electromagnetic wave (electric and magnetic fields perpendicular to each other and the direction of propagation), such as the incident wave 200 within the test space 118. In one example, the TEM system takes advantage of the image theory allowing for 2D scattering and RCS measurements. It should be noted that some data from the measurements, such as RCS and antenna performance data are directly collected. However, other data from the measurements, such as bulk properties and impedance sheet data is acquired by post processing of the data using TEM testing algorithms.

The shape and size of the TEM system 100 can be varied. In one example, the TEM cell 100 has an overall length of 50 feet. In this example, the width of the source side 120 is 8 feet and the width of the object side 122 is 30 feet. Accordingly, the dimensions of the TEM cell 100 may be longer and wider than known current TEM cells.

It should be noted that the thickness of the elements that form the walls of the TEM cell can be varied to change the size of the test space 118. Additionally, the dimensions of the TEM system 100 (or relative dimensions of the elements forming the TEM system 100), including the internal and external dimensions, can be varied as desired or needed, such as based on the particular application or the object 204 to be tested.

Additionally, in some examples, a shield room may be utilized that surrounds the TEM system 100 and is a 100 dB enclosure having dimensions of approximately 80 feet long, 45 feet wide, and 20 feet high, with a floor weight distribution of 250 pounds/square foot.

In various examples, the TEM system 100 provides improvement in the predicted field quality (structure and amplitude) of the testing with a larger fixture size and the addition of perimeter and vertical treatments for RF absorbing structure. Moreover, an enlarged TEM cell of the TEM system 100 (compared to current TEM systems) allows an obstruction free background subtraction of a 15 foot radius region (30 ns time domain gate) in some examples. Additionally, the TEM system 100 has lower and much more stable noise floor levels than current TEM systems. Thus, the TEM system 100 has improved EM and/or mechanical properties over current TEM cells. For example, the TEM system 100 is more rugged, rigid, stable, and less susceptible to damage during operation. Additionally, the TEM system 100 has increased rigidity that improves background subtraction/repeatability.

Figure 24:
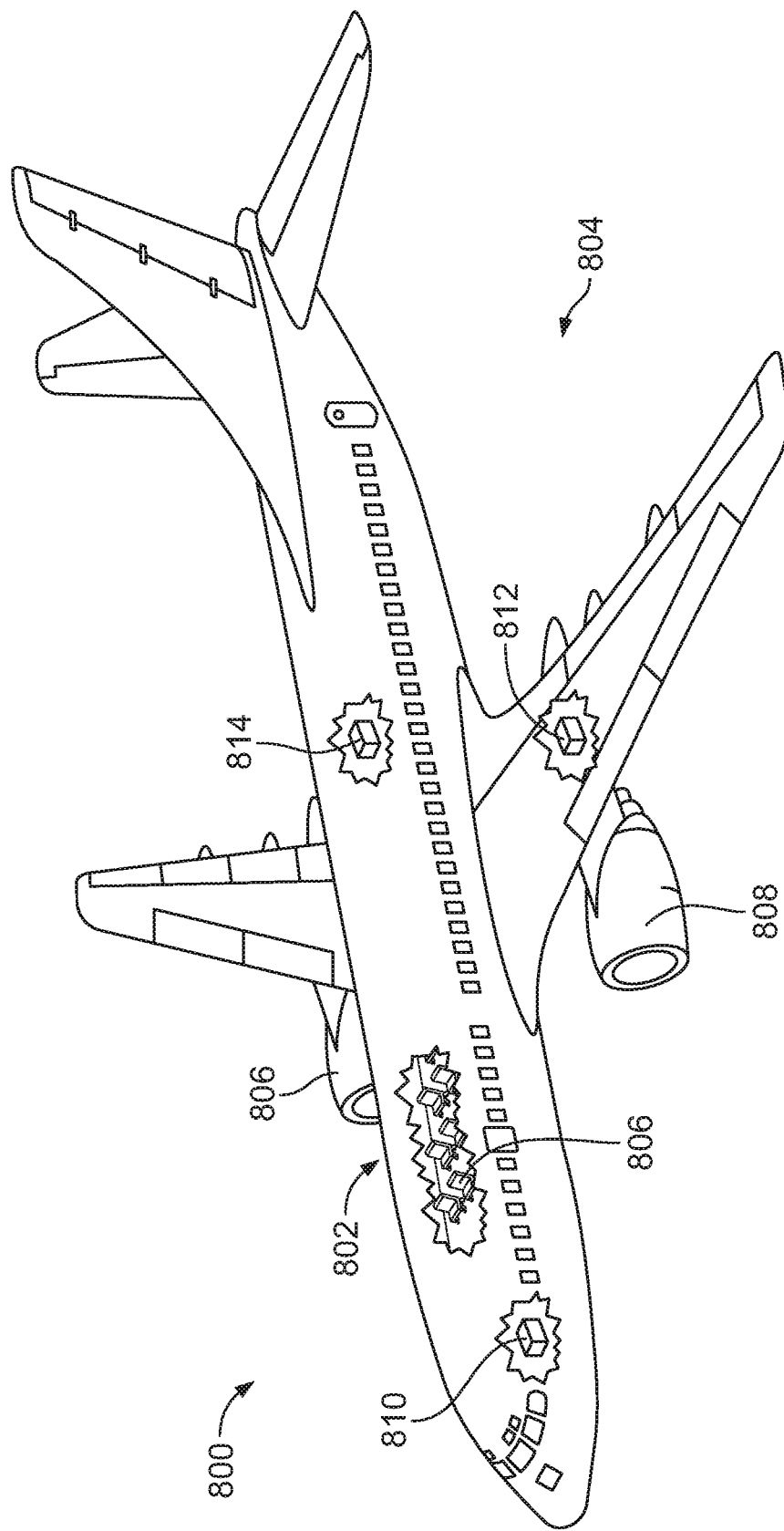
FIG. 24 is a block diagram of a manufacturing environment according to an embodiment of the present disclosure.

Examples of the disclosure may be described in the context of an aircraft manufacturing and service method 700 as shown in FIG. 23 and an aircraft 800 as shown in FIG. 24, for example, to test one or more components of the aircraft 800 during the aircraft manufacturing and service method 700. During pre-production, illustrative method 700 can include specification and design 702 of the aircraft 800 and material procurement 704. During production, component and subassembly manufacturing 706 and system integration 708 of the aircraft 800 take place. Thereafter, the aircraft 800 can go through certification and delivery 710 to be placed in service 712. While in service by a customer, the aircraft 800 is scheduled for routine maintenance and service 714 (which can also include modification, reconfiguration, refurbishment, and so on).

Each of the processes of the illustrative method 700 can be performed or carried out by a system integrator, a third party, and/or an operator (e.g., a customer). For the purposes of this description, a system integrator can include, without limitation, any number of aircraft manufacturers and major-system subcontractors; a third party may include, without limitation, any number of vendors, subcontractors, and suppliers; and an operator may be an airline, leasing company, military entity, service organization, and so on.

As shown in FIG. 24, the aircraft 800 produced by the illustrative method 700 can include an airframe 802 with a plurality of high-level systems 804 and an interior 806. Examples of high-level systems 804 include one or more of a propulsion system 808, an electrical system 810, a hydraulic system 812, and an environmental system 814. Any number of other systems can be included. Although an aerospace example is shown, the principles may be applied to other industries, such as the automotive industry.

Apparatus and methods shown or described herein can be employed during any one or more of the stages of the manufacturing and service method 700. For example, components or subassemblies corresponding to component and subassembly manufacturing 706 can be fabricated or manufactured in a manner similar to components or subassemblies produced while the aircraft 800 is in service. Also, one or more aspects of the apparatus, method, or combination thereof can be utilized during the production states 706 and 708, for example, by substantially expediting assembly of or reducing the cost of an aircraft 800. Similarly, one or more aspects of the apparatus or method realizations, or a combination thereof, can be utilized, for example and without limitation, while the aircraft 800 is in service, e.g., maintenance and service 714.

Thus, various embodiments include a TEM system with improved performance for testing objects, such as components of the aircraft 800. For example, the RF absorbing structure allows for more reliable testing at lower RF frequencies.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

Any range or value given herein can be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above can relate to one embodiment or can relate to several embodiments. The embodiments are not limited to those that solve any or all of the stated problems or those that have any or all of the stated benefits and advantages. It will further be understood that reference to 'an' item refers to one or more of those items.

The embodiments illustrated and described herein as well as embodiments not specifically described herein but within the scope of aspects of the claims constitute exemplary means for TEM testing.

The term "comprising" is used in this specification to mean including the feature(s) or act(s) followed thereafter, without excluding the presence of one or more additional features or acts.

The order of execution or performance of the operations in examples of the disclosure illustrated and described herein is not essential, unless otherwise specified. That is, the operations can be performed in any order, unless otherwise specified, and examples of the disclosure can include additional or fewer operations than those disclosed herein. For example, it is contemplated that executing or performing a particular operation before, contemporaneously with, or after another operation (e.g., different steps) is within the scope of aspects of the disclosure.

When introducing elements of aspects of the disclosure or the examples thereof, the articles "a," "an," "the," and "said" are intended to mean that there are one or more of the elements. The terms "comprising," "including," and "having" are intended to be inclusive and mean that there can be additional elements other than the listed elements. The term "exemplary" is intended to mean "an example of." The phrase "one or more of the following: A, B, and C" means "at least one of A and/or at least one of B and/or at least one of C."

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

It is to be understood that the above description is intended to be illustrative, and not restrictive. For example, the above-described embodiments (and/or aspects thereof) can be used in combination with each other. In addition, many modifications can be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are example embodiments. Many other embodiments will be apparent to those of ordinary skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not to be interpreted based on 35 U.S.C. § 112(f), unless and until such claim limitations expressly use the phrase "means for" followed by a statement of function void of further structure.

This written description uses examples to disclose the various embodiments of the disclosure, including the best mode, and also to enable any person of ordinary skill in the art to practice the various embodiments of the disclosure, including making and using any devices or systems and performing any incorporated methods. The patentable scope of the various embodiments of the disclosure is defined by the claims, and can include other examples that occur to those persons of ordinary skill in the art. Such other examples are intended to be within the scope of the claims if the examples have structural elements that do not differ from the literal language of the claims, or if the examples include equivalent structural elements with insubstantial differences from the literal language of the claims.

The invention claimed is:

1. An assembly for a transverse electromagnetic (TEM) system, the assembly comprising:
    a support frame comprising an upper plate and a lower plate the upper plate defining a first inner surface and an opposed first outer surface, the first inner surface oriented toward a TEM test space, the lower plate defining a second inner surface and an opposed second outer surface, the second inner surface oriented toward the first inner surface of the upper plate and toward the TEM test space, the TEM test space defined between the first inner surface of the upper plate and the second inner surface of the lower plate;
    at least one resistive sheet coupled to at least one of the upper plate or the lower plate the at least one resistive sheet extending parallel to the upper plate and lower plate from a periphery of the support frame, wherein the resistive sheet has an inner end disposed proximate the at least one of the upper plate or lower plate and an outer end disposed opposite the inner end, wherein the resistive sheet has a variable resistance that is greater at the outer end than at the inner end.

2. The assembly of claim 1, wherein the at least one resistive sheet includes an upper resistive sheet coupled to the upper plate, and a lower resistive sheet coupled to the lower plate.

3. The assembly of claim 2, further comprising
a plurality of lower block portions disposed around an exterior of the support frame;
a plurality of upper block portions disposed above the plurality of lower block portions; and
a plurality of intermediate block portions interposed between the plurality of lower block portions and upper block portions;
wherein the upper resistive sheet is interposed between the plurality of upper block portions and the plurality of intermediate block portions, and the lower resistive sheet is interposed between the plurality of lower block portions and the plurality of intermediate block portions.

4. The assembly of claim 1, wherein the resistive sheet includes a grid of resistive portions configured to provide the variable resistance.

5. The assembly of claim 1, wherein the at least one resistive sheet has a resistive side and a substrate side, the resistive side oriented away from the at least one of the upper plate or lower plate the substrate side oriented toward the at least one of the upper plate or lower plate.

6. The assembly of claim 5, wherein the at least one resistive sheet is coupled to the at least one of the upper plate or lower plate with conductive tape.

7. The assembly of claim 1, wherein the support frame defines a length extending from a source side toward an object side and width extending normal to the length, the assembly further comprising resistive blocks disposed along the width proximate the object side, each resistive block having first and second resistive sides opposed to each other and oriented along the width.

8. The assembly of claim 7, wherein the resistive sides have a front end and a rear end, the front end closer to the source side than the rear end, wherein the resistive sides have a variable resistance that is greater at the rear end than at the front end.

9. The assembly of claim 8, wherein the first resistive side includes a first tapered resistive member tapered toward a bottom of the corresponding resistive block, and the second resistive side includes a second tapered resistive member tapered toward a top of the corresponding resistive block.

10. The assembly of claim 7, further comprising at least one intermediate block interposed between resistive blocks.

11. An assembly for a transverse electromagnetic (TEM) system, the assembly comprising:
a support frame comprising an upper plate and a lower plate the upper plate defining a first inner surface and an opposed first outer surface, the first inner surface oriented toward a TEM test space, the lower plate defining a second inner surface and an opposed second outer surface, the second inner surface oriented toward the first inner surface of the upper plate and toward the TEM test space, the TEM test space defined between the first inner surface of the upper plate and the second inner surface of the lower plate wherein the support frame defines a length extending from a source side toward an object side and width extending normal to the length; and
resistive blocks disposed along the width proximate the object side, each resistive block having first and second resistive sides opposed to each other and oriented along the width.

12. The assembly of claim 11, wherein the resistive sides have a front end and a rear end, the front end closer to the source side than the rear end, wherein the resistive sides have a variable resistance that is greater at the rear end than at the front end.

13. The assembly of claim 12, wherein the first resistive side includes a first tapered resistive member tapered toward a bottom of the corresponding resistive block, and the second resistive side includes a second tapered resistive member tapered toward a top of the corresponding resistive block.

14. The assembly of claim 11, further comprising at least one intermediate block interposed between resistive blocks.

15. A method comprising:
providing a support frame comprising an upper plate and a lower plate the upper plate defining a first inner surface and an opposed first outer surface, the first inner surface oriented toward a transverse electromagnetic (TEM) test space, the lower plate defining a second inner surface and an opposed second outer surface, the second inner surface oriented toward the first inner surface of the upper plate and toward the TEM test space, the TEM test space defined between the first inner surface of the upper plate and the second inner surface of the lower plate;
coupling at least one resistive sheet to at least one of the upper plate or the lower plate the at least one resistive sheet extending parallel to the upper plate and lower plate from an exterior of the support frame, wherein the resistive sheet has an inner end disposed proximate the at least one of the upper plate or lower plate and an outer end disposed opposite the inner end, wherein the resistive sheet has a variable resistance that is greater at the outer end than at the inner end.

16. The method of claim 15, further comprising coupling an upper resistive sheet to the upper plate, and coupling a lower resistive sheet to the lower plate.

17. The method of claim 15, further comprising providing a resistive grid of resistive portions on the resistive sheet configured to provide the variable resistance.

18. The method of claim 15, further comprising providing the at least one resistive sheet with a resistive side and a substrate side, orienting the resistive side away from the at least one of the upper plate or lower plate and orienting the substrate side toward the at least one of the upper plate or lower plate.

19. The method of claim 18, further comprising coupling the at least one resistive sheet to the at least one of the upper plate or lower plate with conductive tape.

20. The method of claim 15, wherein the support frame defines a length extending from a source side toward an object side and width extending normal to the length, the method further comprising disposing resistive blocks along the width proximate the object side, each resistive block having first and second resistive sides opposed to each other and oriented along the width.

* * * * *